United States Patent
Zhang et al.

(10) Patent No.: US 12,224,011 B2
(45) Date of Patent: Feb. 11, 2025

(54) NON-VOLATILE MEMORY WITH CONCURRENT SUB-BLOCK PROGRAMMING

(71) Applicant: WESTERN DIGITAL TECHNOLOGIES, INC., San Jose, CA (US)

(72) Inventors: Ke Zhang, Shanghai (CN); Liang Li, Shanghai (CN); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 397 days.

(21) Appl. No.: 17/726,923

(22) Filed: Apr. 22, 2022

(65) Prior Publication Data
US 2023/0343395 A1 Oct. 26, 2023

(51) Int. Cl.
G11C 16/08 (2006.01)
G11C 16/10 (2006.01)
G11C 16/12 (2006.01)

(52) U.S. Cl.
CPC ............ *G11C 16/08* (2013.01); *G11C 16/107* (2013.01); *G11C 16/12* (2013.01)

(58) Field of Classification Search
CPC ........ G11C 16/107; G11C 16/12; G11C 16/08
USPC .................................................... 365/185.23
See application file for complete search history.

(56) References Cited

U.S. PATENT DOCUMENTS

| | | |
|---|---|---|
| 6,240,040 B1 | 5/2001 | Akaogi |
| 6,871,257 B2 | 3/2005 | Conley |
| 6,883,044 B1 | 4/2005 | Roohparvar |
| 7,020,026 B2 | 3/2006 | Guterman |
| 7,626,865 B2 | 12/2009 | Ha |
| 9,514,827 B1 * | 12/2016 | Nam ..................... G06F 3/0619 |
| 9,570,178 B2 | 2/2017 | Joo |
| 9,842,657 B1 | 12/2017 | Dutta |
| 9,922,992 B1 | 3/2018 | Yu |
| 11,087,849 B2 | 8/2021 | Chin et al. |
| 11,101,001 B2 | 8/2021 | Chin et al. |
| 2004/0233722 A1 | 11/2004 | Martines |
| 2006/0250846 A1 | 11/2006 | Park |
| 2007/0086247 A1 | 4/2007 | Lutze |
| 2007/0143570 A1 | 6/2007 | Gorobets |
| 2008/0089130 A1 | 4/2008 | Park |
| 2008/0239824 A1 | 10/2008 | Sekar |
| 2008/0247236 A1 | 10/2008 | Lee |
| 2009/0168534 A1 | 7/2009 | Park |
| 2009/0196102 A1 | 8/2009 | Kim |
| 2009/0196103 A1 | 8/2009 | Kim |
| 2009/0225600 A1 | 9/2009 | Park |
| 2010/0290286 A1 | 11/2010 | Koya |

(Continued)

FOREIGN PATENT DOCUMENTS

KR 20140017296 A 2/2014
KR 101448169 B1 10/2014
(Continued)

Primary Examiner — Sung Il Cho
(74) Attorney, Agent, or Firm — Pearl Cohn Zedek Latzer Baratz LLP

(57) ABSTRACT

A non-volatile memory system includes a control circuit connected to non-volatile memory cells. The control circuit is configured to concurrently program memory cells connected to different word lines that are in different sub-blocks of different blocks in different planes of a die.

18 Claims, 26 Drawing Sheets

(56) References Cited

U.S. PATENT DOCUMENTS

| | | |
|---|---|---|
| 2011/0010484 A1 | 1/2011 | Sprouse |
| 2011/0138100 A1 | 6/2011 | Sinclair |
| 2011/0222348 A1 | 9/2011 | Kim |
| 2011/0273944 A1 | 11/2011 | Park |
| 2012/0020161 A1 | 1/2012 | Haukness |
| 2013/0128675 A1 | 5/2013 | Kim |
| 2013/0166825 A1 | 6/2013 | Kim |
| 2013/0223147 A1 | 8/2013 | Kwak |
| 2013/0235673 A1 | 9/2013 | Kwak |
| 2014/0063952 A1 | 3/2014 | Hara |
| 2014/0104965 A1 | 4/2014 | Tran |
| 2015/0380097 A1 | 12/2015 | Sato |
| 2016/0071594 A1 | 3/2016 | Paudel |
| 2016/0078951 A1 | 3/2016 | Lin |
| 2016/0099047 A1 | 4/2016 | Lee |
| 2016/0172043 A1 | 6/2016 | Kang |
| 2018/0211703 A1 | 7/2018 | Choi et al. |
| 2018/0276070 A1 | 9/2018 | Lin |
| 2018/0322932 A1 | 11/2018 | Periyannan |
| 2018/0374541 A1 | 12/2018 | Jung |
| 2018/0374551 A1 | 12/2018 | Hu |
| 2019/0163620 A1 | 5/2019 | Muthiah |
| 2019/0278705 A1 | 9/2019 | Park |
| 2019/0348127 A1* | 11/2019 | Chin .................. G11C 16/08 |
| 2019/0348129 A1* | 11/2019 | Chin .................. G11C 8/12 |
| 2021/0358553 A1 | 11/2021 | Yang et al. |

FOREIGN PATENT DOCUMENTS

| | | |
|---|---|---|
| KR | 20160099579 A | 8/2016 |
| KR | 101701361 B1 | 2/2017 |

* cited by examiner

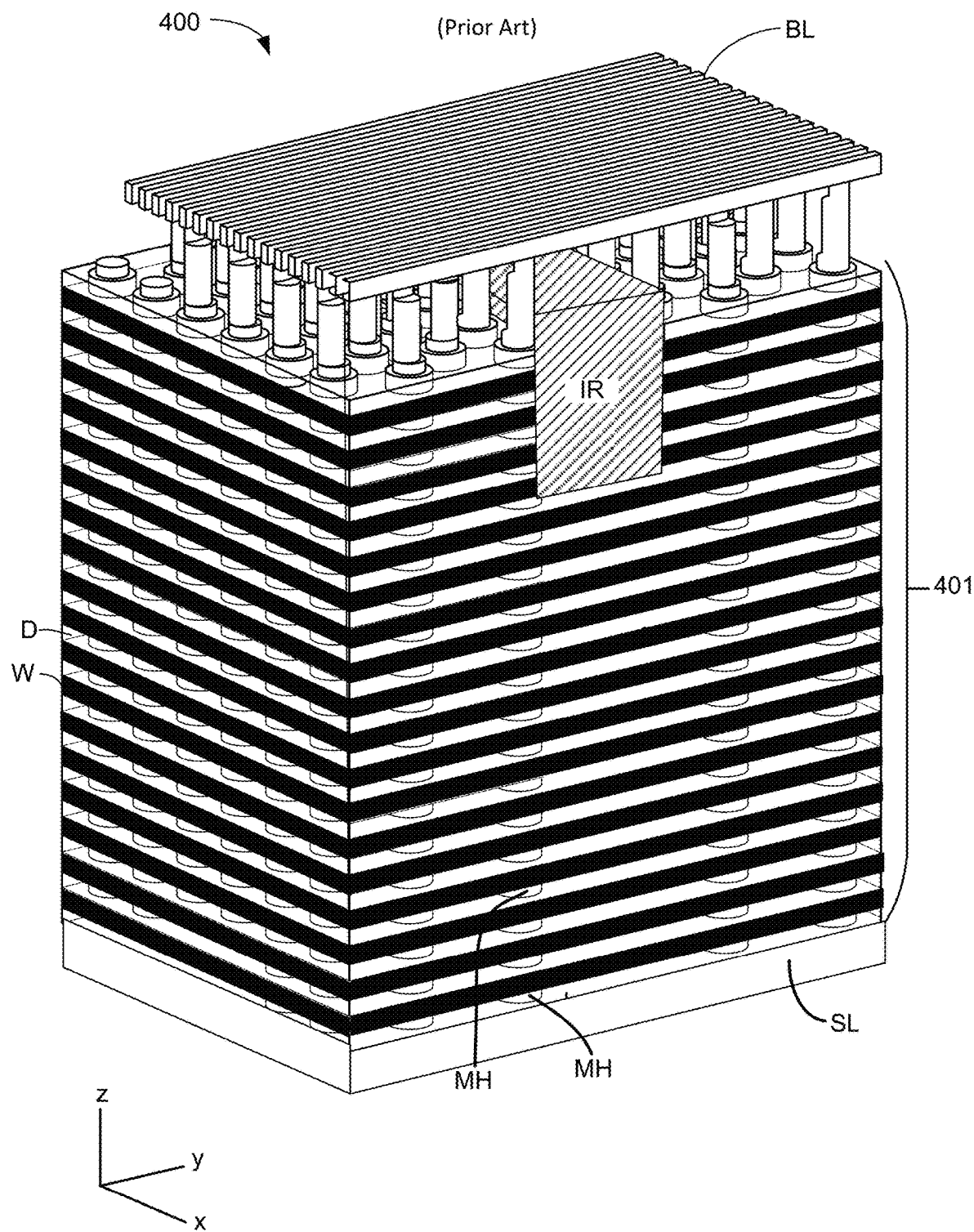

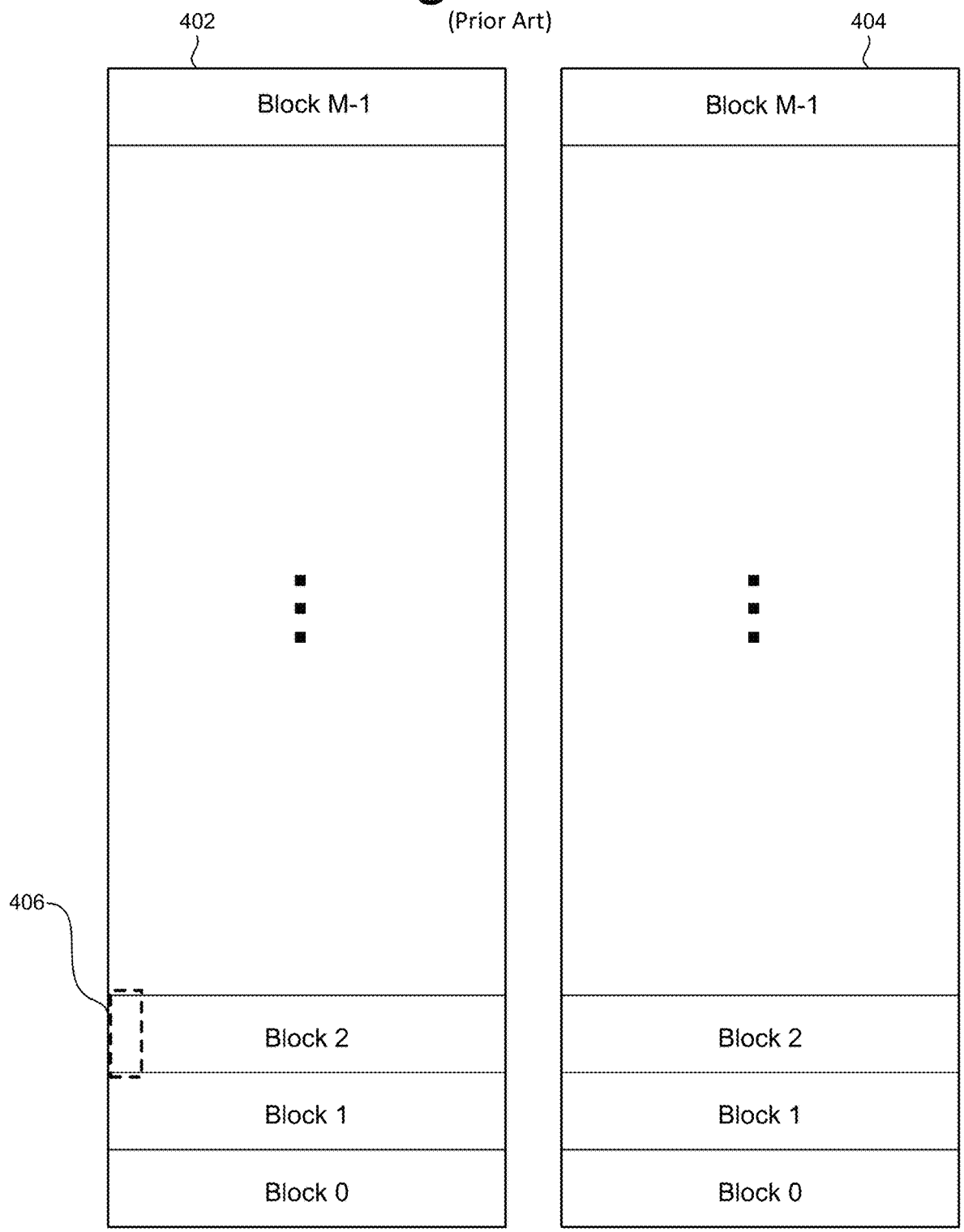

Figure 13

| offset region | Vpgm offset | PW offset |
|---|---|---|
| R0 | Vpgm-offset-0 | pw-offset-0 |
| R1 | Vpgm-offset-1 | pw-offset-1 |
| R2 | Vpgm-offset-2 | pw-offset-2 |
| R3 | Vpgm-offset-3 | pw-offset-3 |
| R4 | Vpgm-offset-4 | pw-offset-4 |
| R5 | Vpgm-offset-5 | pw-offset-5 |
| R6 | Vpgm-offset-6 | pw-offset-6 |

Figure 14

| | | | | | | | |
|---|---|---|---|---|---|---|---|
| | | | | 0 | 0 | 0 | -0.4 |
| | | | | 0 | 0 | 1 | × | 0.0 |
| | | | | 0 | 1 | 0 | 0.4 |
| | | | | 0 | 1 | 1 | 0.8 |
| | | | | 1 | 0 | 0 | 1.2 |
| | | | | 1 | 0 | 1 | 1.6 |
| | | | | 1 | 1 | 0 | 2.0 |
| | | | | 1 | 1 | 1 | 2.4 |

Figure 15

| | | | | | | | |
|---|---|---|---|---|---|---|---|
| | | | | 0 | 0 | 0 | × | 0.00 |
| | | | | 0 | 0 | 1 | 0.32 |
| | | | | 0 | 1 | 0 | 0.64 |
| | | | | 0 | 1 | 1 | 0.96 |
| | | | | 1 | 0 | 0 | 1.28 |
| | | | | 1 | 0 | 1 | -0.96 |
| | | | | 1 | 1 | 0 | -0.64 |
| | | | | 1 | 1 | 1 | -0.32 |

Figure 16

| [7] | [6] | [5] | [4] | [3] | [2] | [1] | [0] | default | option |
|---|---|---|---|---|---|---|---|---|---|
| | | | | 0 | 0 | | | | Disable (normal block) WL layer offset |
| | | | | 0 | 1 | | | | Based on plane with min P5TOP7 |
| | | | | 1 | 0 | | | × | Based on plane with max P5TOP7 |

Figure 17

1702: receiving data to be stored in multiple planes of non-volatile memory cells, each plane comprising blocks of non-volatile memory cells, each block comprises a stack of dielectric layers alternating with conductive layers and vertical columns of materials through the stack that form the memory cells, at least a subset of the conducting layers form 2N word lines, each block comprises sub-blocks including an upper sub-block and a lower sub-block, the vertical columns have diameters that increase from bottom of the vertical columns to top of the vertical columns within the sub-blocks

1704: one or more control circuits connected to the non-volatile memory structure program memory cells of upper sub-blocks in a sequence from bottom word line to top word line such that word lines of upper sub-blocks have a sequence number based on when memory cells connected to the respective word line are programmed in the sequence from bottom word line to top word line

1706: one or more control circuits program memory cells of lower sub-blocks in a sequence from top word line to bottom word line such that word lines of lower sub-blocks have a sequence number based on when memory cells of the respective word line are programmed in the sequence from top word line to bottom word line

1708: determine an offset region for the data to be programmed in the multiple planes, each word line of a lower sub-block has a corresponding word line of an upper sub-block that has a same sequence number such that a pair of corresponding word lines comprises a word line of a lower sub-block and a word line of an upper sub-block both having the same sequence number, the vertical columns are divided into zones based on diameter such that each zone includes a contiguous set of word lines within a single range of diameters of the vertical columns, each block includes a set of offset regions, each offset region includes one or more pairs of corresponding word lines such that each word line of the respective offset region that is in an upper sub-block is in a same zone and each word line of the respective offset region that is in a lower sub-block is in a same zone, each offset region is associated with a program voltage offset and a program pulse width offset

1710: the one or more control circuits concurrently program memory cells connected to a pair of corresponding word lines including WLn in a lower sub-block of first block of a first plane and WLm in an upper sub-block of second block in a second plane, such that m+n=2N-1, using a common programming voltage signal applied to WLn for the first block of the first plane and WLm for the second block of the second plane that comprises a plurality of voltage pulses having a pulse width of a standard pulse width modified by a pulse width offset for an offset region that includes WLn and WLm and magnitudes of standard program signal magnitudes modified by a program voltage offset for the offset region that includes WLn and WLm

1717: the one or more control circuits are configured to pre-charge NAND strings connected to WLn in the lower sub-block of first block of the first plane and NAND strings connected to WLm in the upper sub-block of second block in the second plane for a time period equal to a standard pre-charge time period modified by a pre-charge offset for the offset region that includes WLn and WLm (Line 1800) ZZh -- ADD(yyh) -- Data(01h)    // Enable multi plane CSB mode
(Line 1802) E3h-- A2h- 80h- address(5cyc/PB0) -- Data in -- 11h ==> busy -> ready =>
(Line 1804) E3h-- A2h- 80h- address(5cyc/PB1) -- Data in -- 11h ==> busy -> ready =>
(Line 1806) E3h-- A2h- 80h- address(5cyc/PB2) -- Data in -- 11h ==> busy -> ready =>
(Line 1808) E3h-- A2h- 80h- address(5cyc/PB3) -- Data in -- 10h ==> busy (tProg) -> ready =>
(Line 1810) ZZh -- ADD(yyh) -- Data(00h)    // Disable multi plane CSB mode (optional)

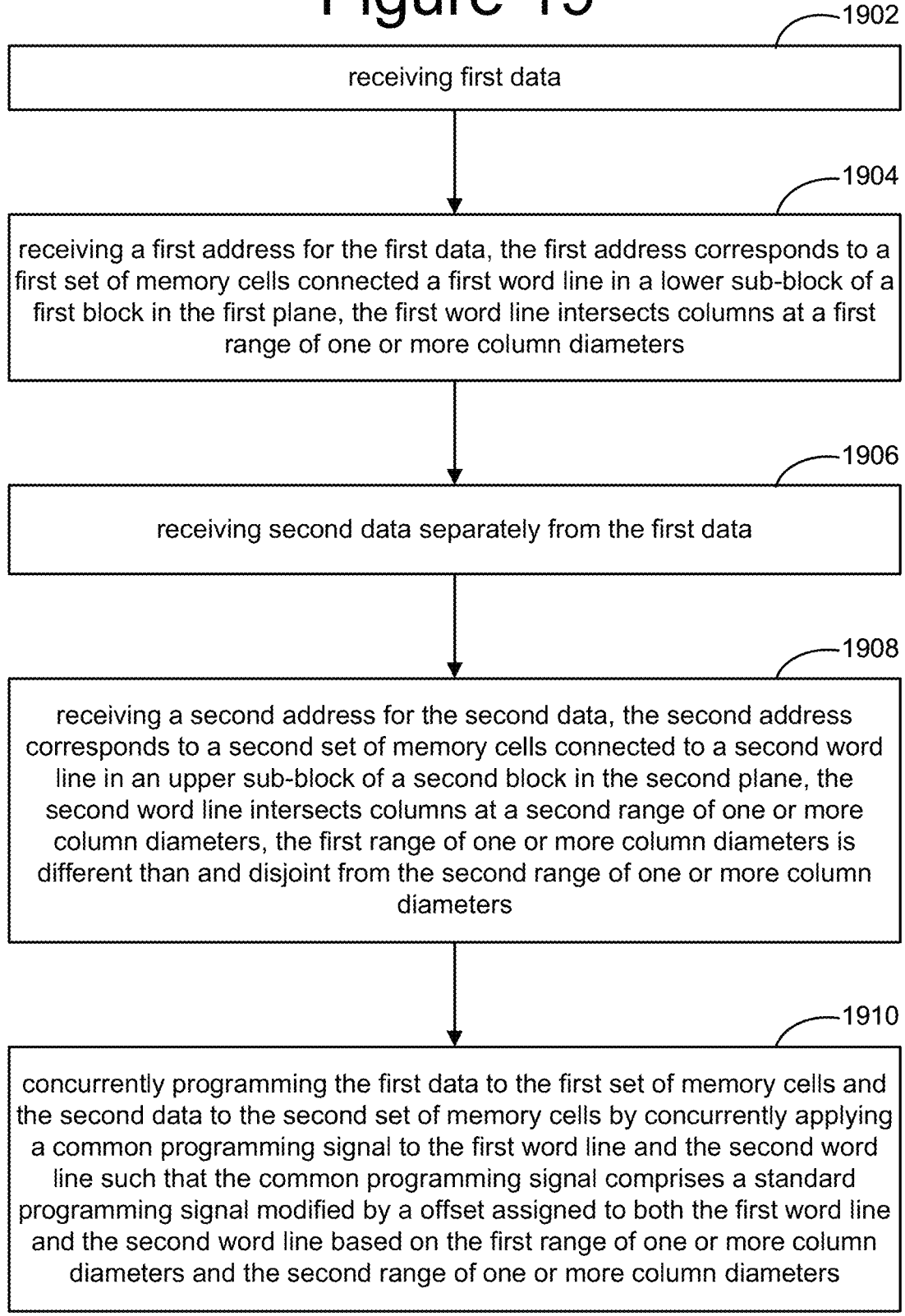

NON-VOLATILE MEMORY WITH CONCURRENT SUB-BLOCK PROGRAMMING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). It is important that the process for programming data into the memory system be fast so that the host device (or other client) does not have to wait very long for the memory system to finish the programming.

BRIEF DESCRIPTION OF THE DRAWINGS

Like-numbered elements refer to common components in the different figures.

FIG. 4 is a perspective view of a portion of one embodiment of a monolithic three dimensional memory structure.

FIG. 4A is a block diagram of one embodiment of a memory structure having two planes.

FIG. 13 is a table describing an example set of predetermined offsets for modifying a standard programming voltage signal.

FIG. 14 is a table describing an example set of predetermined offsets for modifying a standard programming voltage signal.

FIG. 15 is a table describing an example set of predetermined offsets for modifying a standard programming voltage signal.

FIG. 16 is a table describing an example of modifying a time period of pre-charging NAND strings.

FIG. 17 is a flow chart describing one embodiment of a process for concurrently programming memory cells connected to different word lines in different sub-blocks of different blocks in different planes.

FIG. 19 is a flow chart describing one embodiment of a process for concurrently programming memory cells connected to different word lines in different sub-blocks of different blocks in different planes.

DETAILED DESCRIPTION

In some embodiments, a non-volatile memory system includes a control circuit connected to a memory structure. The memory structure includes blocks of non-volatile memory cells. Each block comprises a stack of dielectric layers alternating with conductive layers and vertical columns of materials through the stack that form the memory cells. To increase performance during programming, the plurality of memory cells are arranged in multiple planes such that the memory system can perform programming for multiple planes in parallel; therefore, enabling more memory cells to be programmed during a given time period. To increase efficiency of the system, the various blocks within the multiple planes are divided into sub-blocks such that each sub-block can be erased, read and programmed independently. To realize the benefits of multiple planes and the use of sub-blocks, a memory system is proposed that simultaneously programs memory cells connected to different word lines that are in different sub-blocks of different blocks in different planes of a die by dividing the blocks and vertical columns into offset regions based on diameter of the vertical columns.

Figure 1:
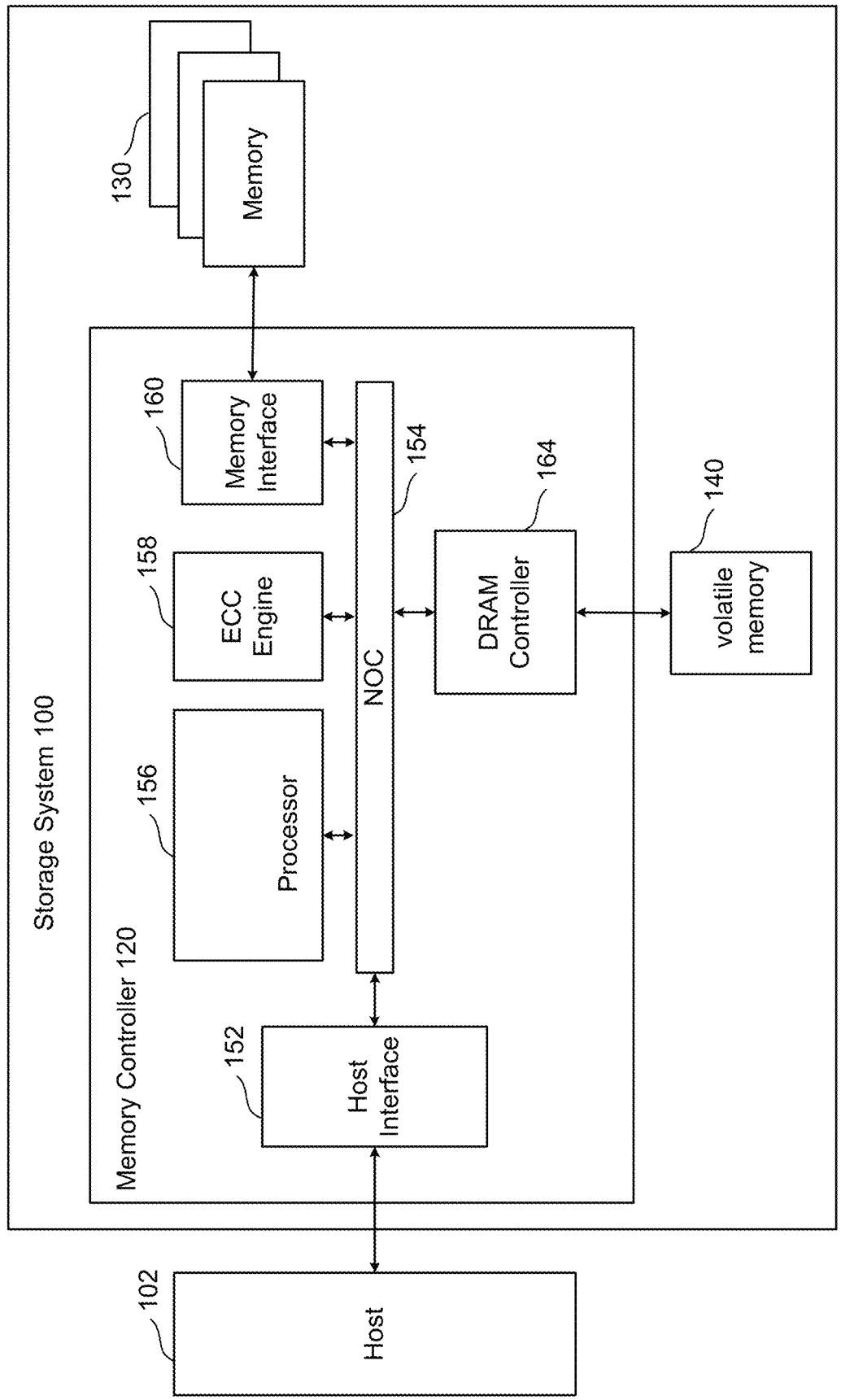
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
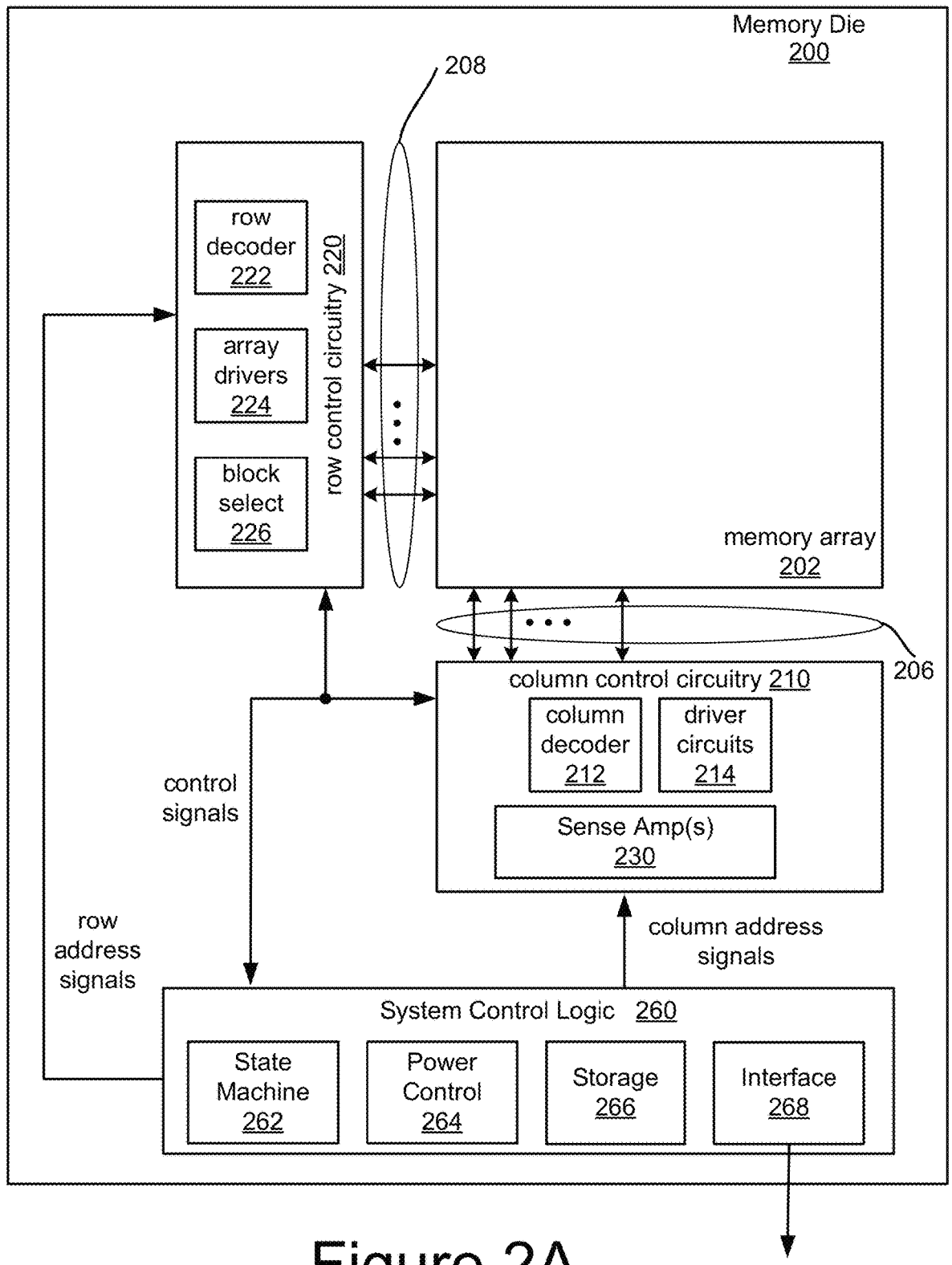
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
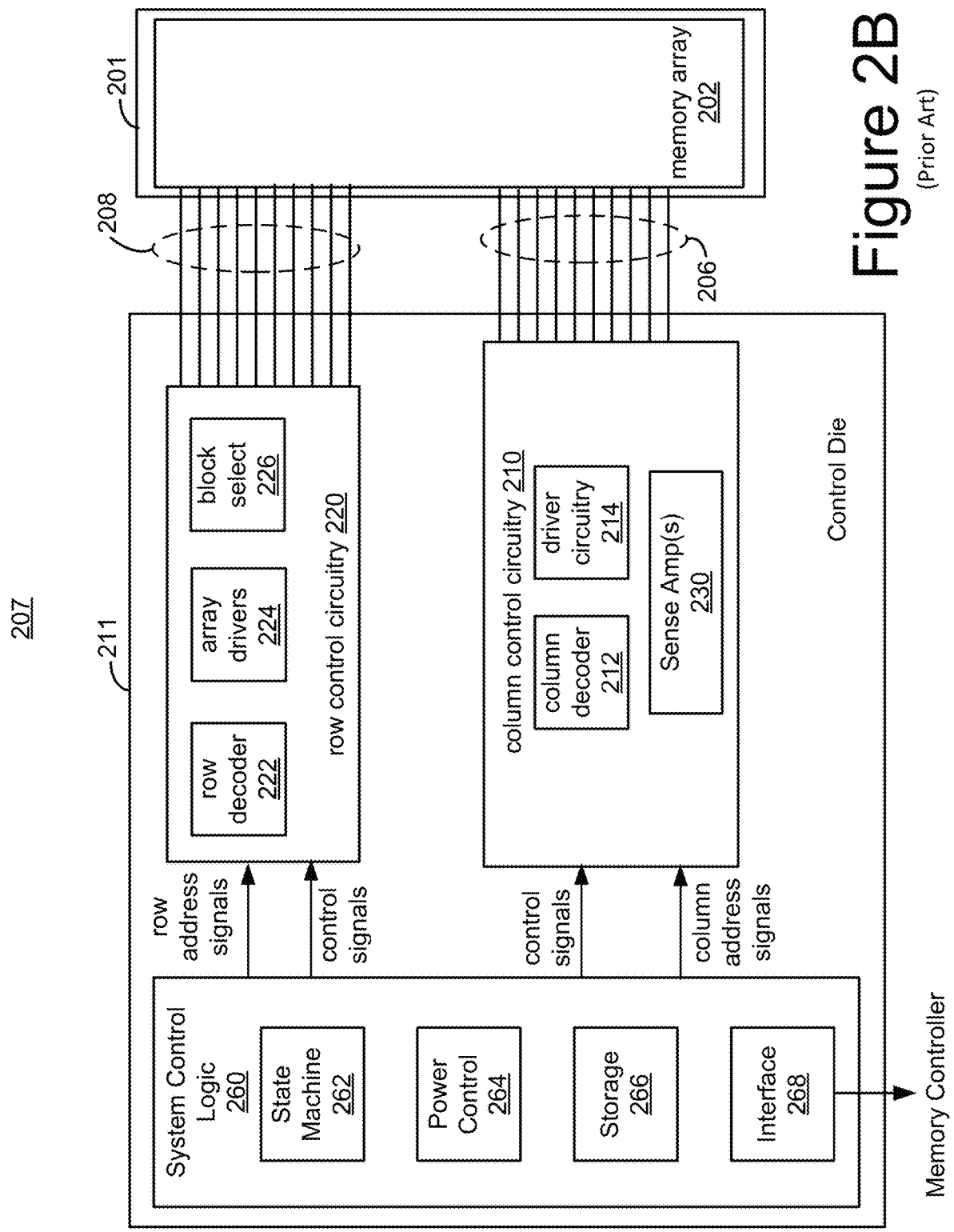
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212 and driver circuitry 214, and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
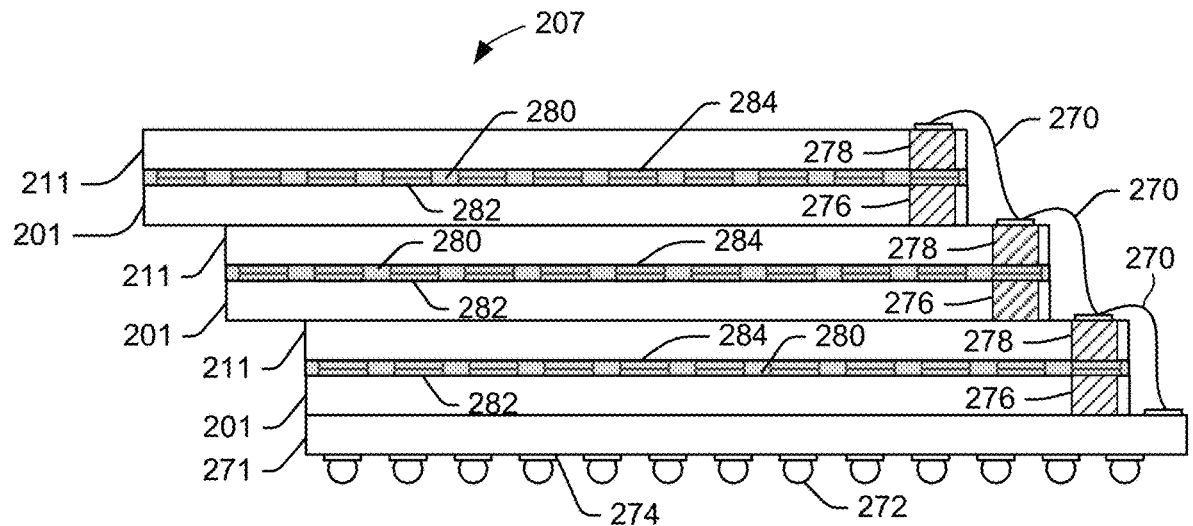
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
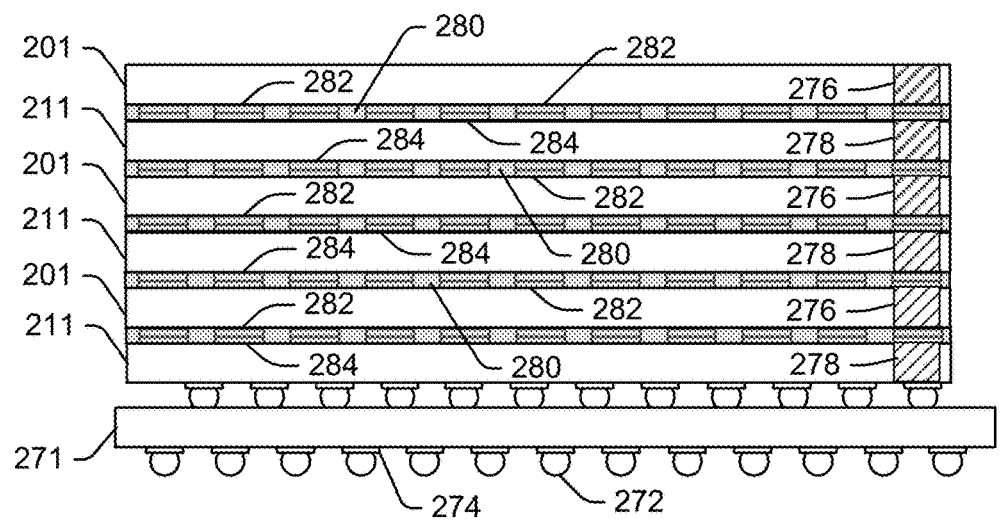

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes four planes, eight planes or more than eight planes.

Figure 4B:
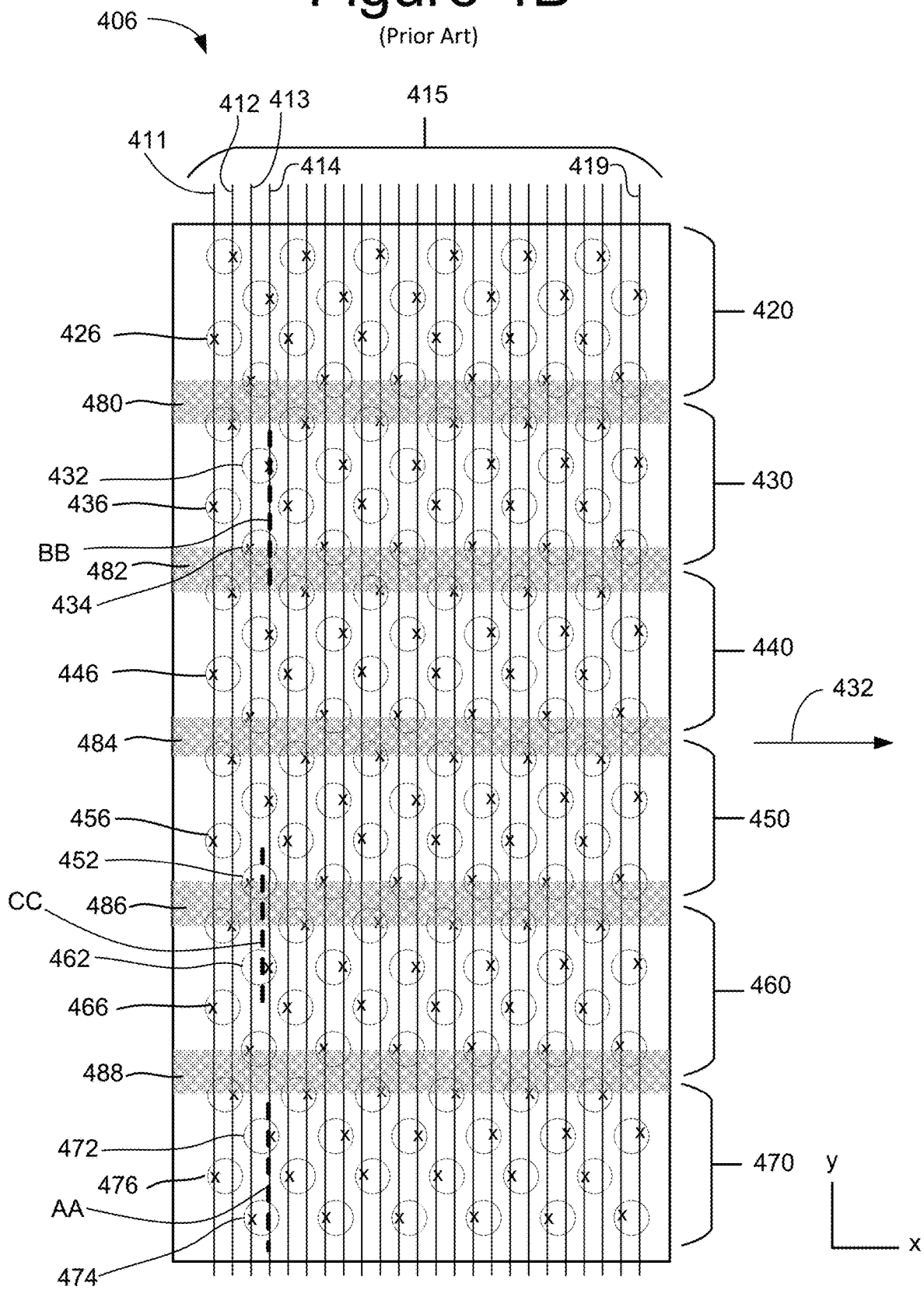
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO₂; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470. In one embodiment, the isolation regions only divide the layers used to implement select gates so that NAND strings in different regions can be independently selected. In one example implementation, a bit line only connects to one vertical column/NAND string in each of regions 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
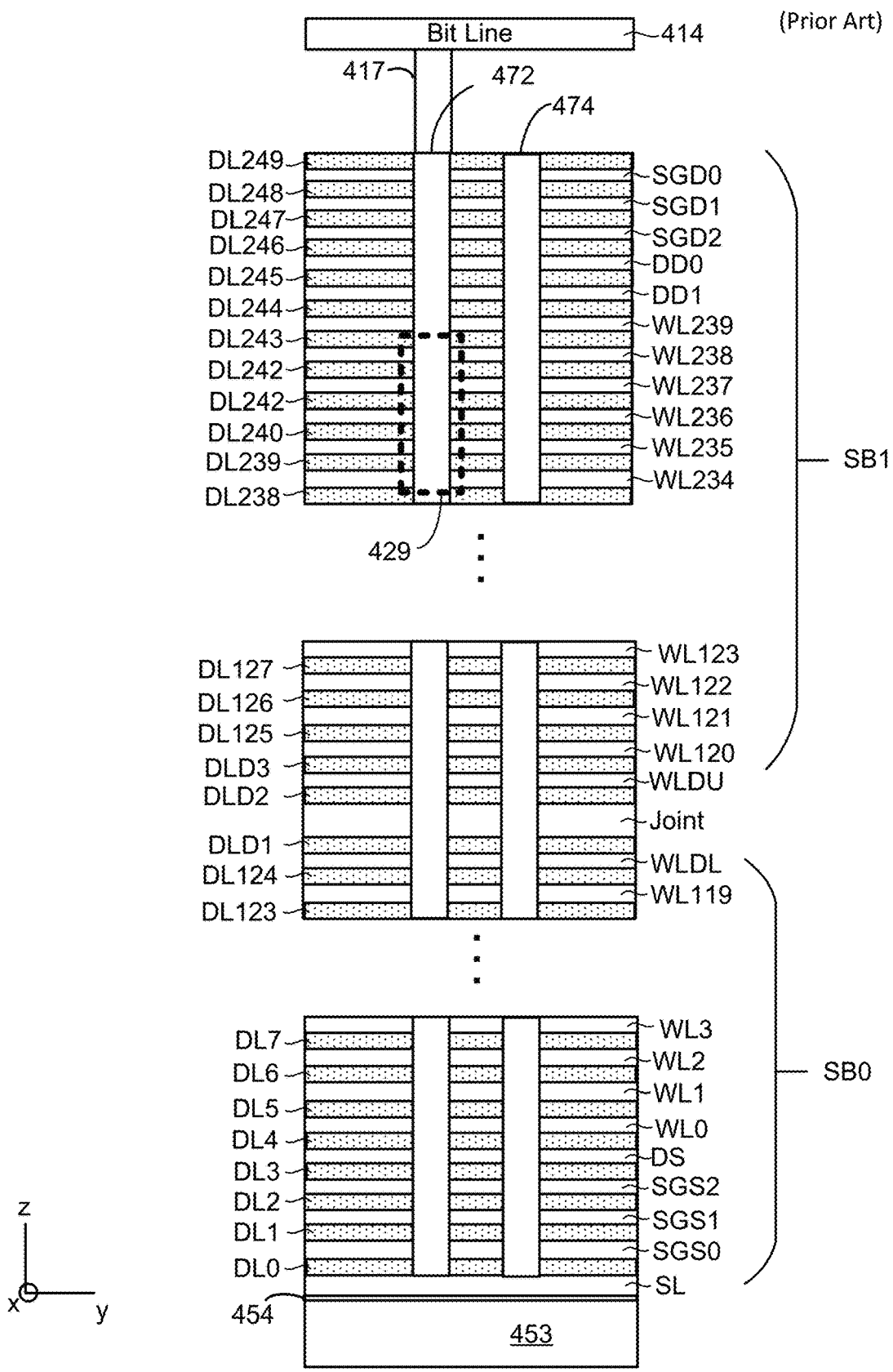
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2 (that form select lines); three source side select layers SGS0, SGS1, and SGS2 (that form select lines); three dummy word line layers DD0, DD1, and DDS; two hundred and forty word line layers WL0-WL239 for connecting to data memory cells, and dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO₂. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4C also shows a Joint area. In one embodiment it is expensive and/or challenging to etch so many word line layers intermixed with dielectric layers. To ease this burden, one embodiment includes laying down a first stack of word line layers alternating with dielectric layers, laying down the Joint area, and laying down a second stack of word line layers alternating with dielectric layers. The Joint area is positioned between the first stack and the second stack. The Joint area is used to connect to the first stack to the second stack. In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

In one embodiment, a block is divided into sub-blocks. For example, the first/lower stack of each vertical column is part of a lower sub-block SB0 and the second/upper stack is of each vertical column is part of an upper sub-block SB1.

Figure 4D:
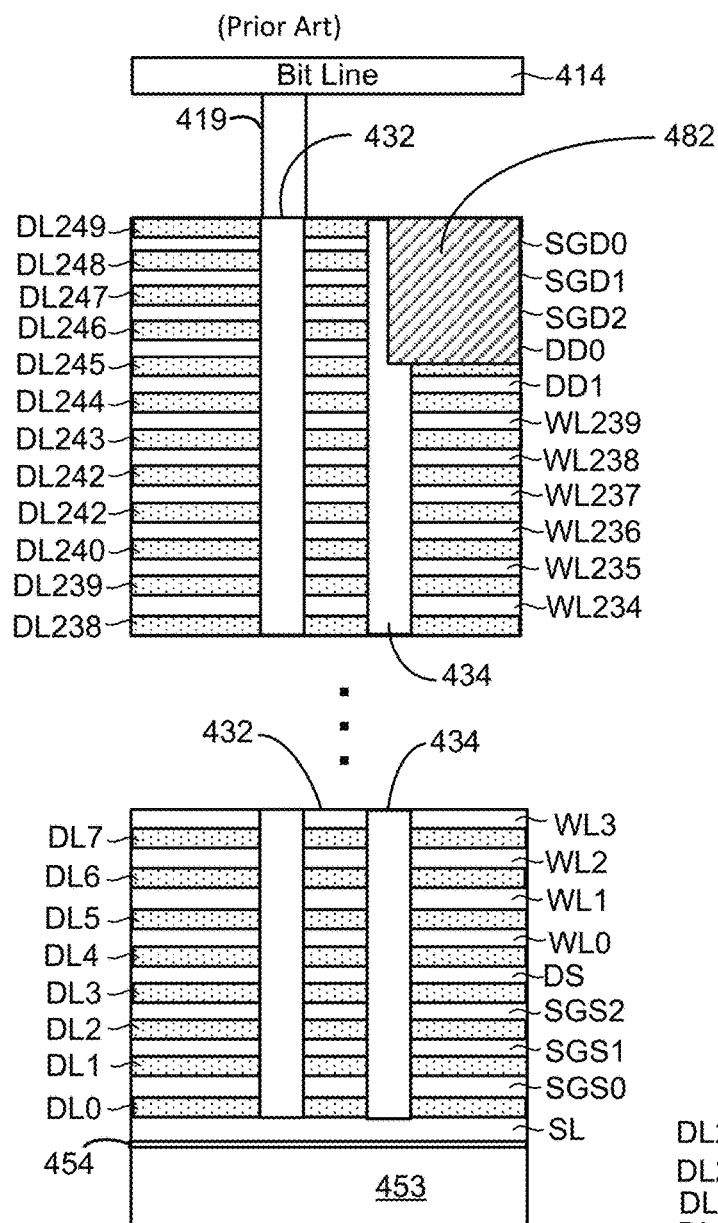
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/ NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
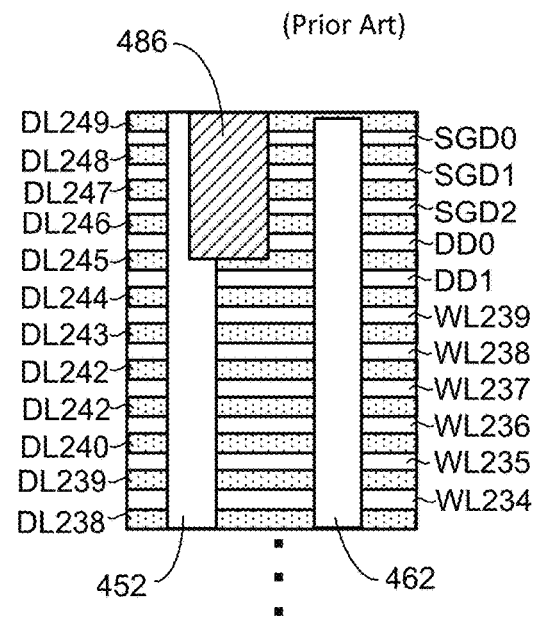
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
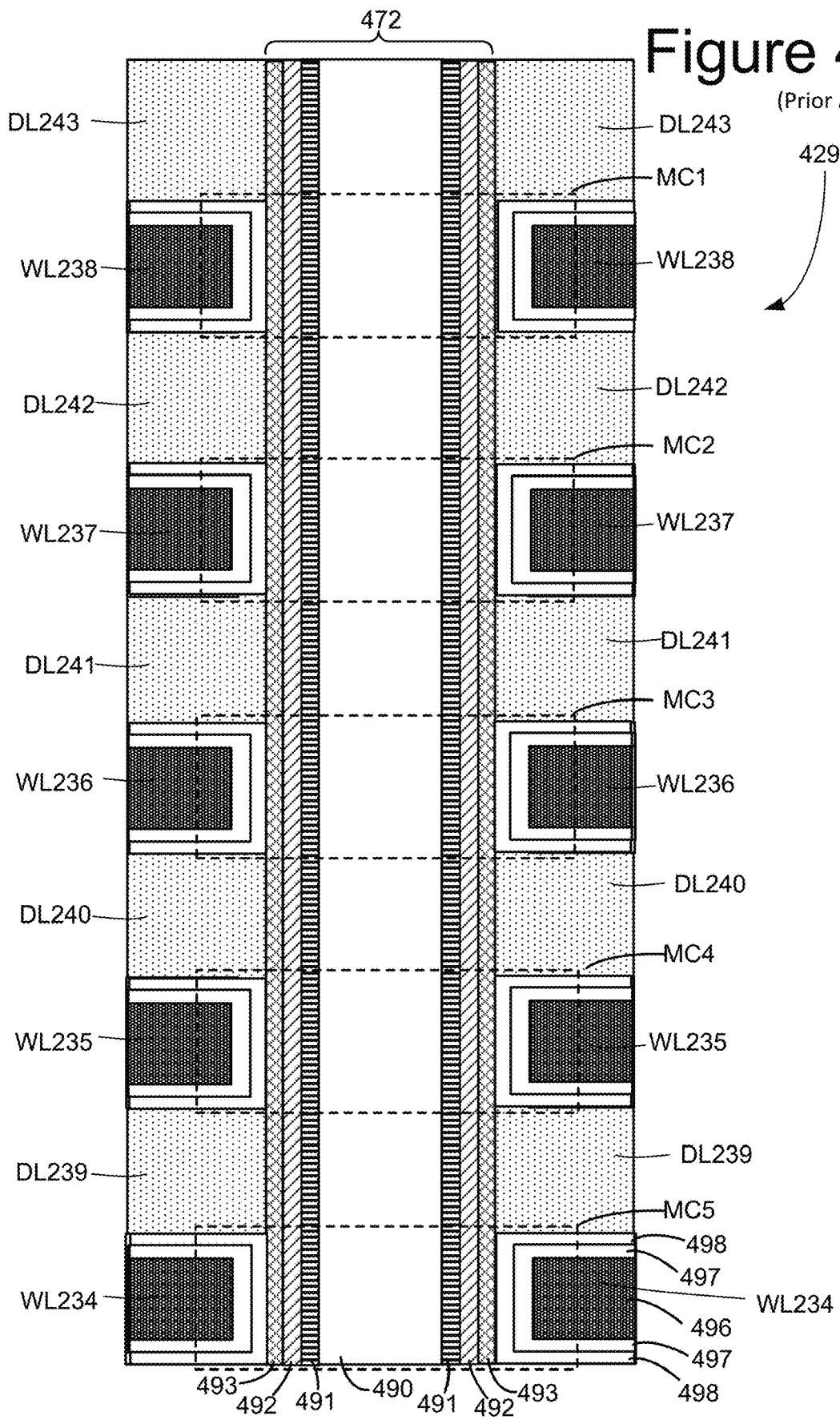
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DLL43, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
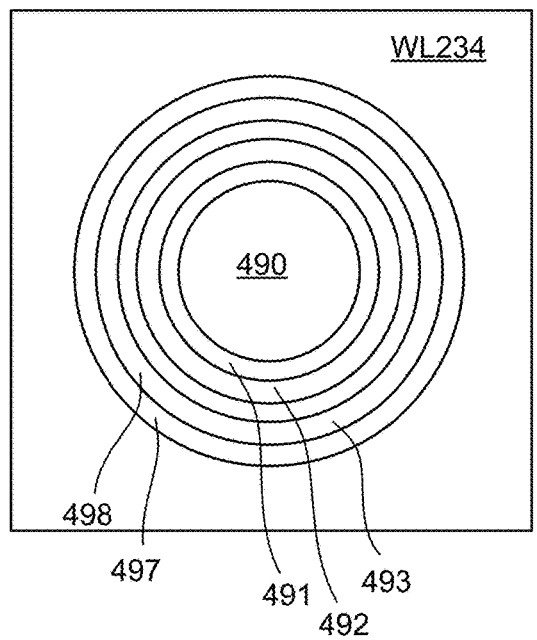
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
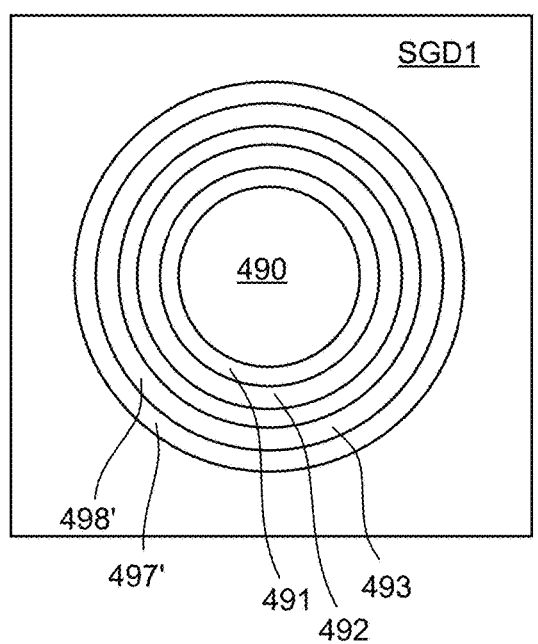
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
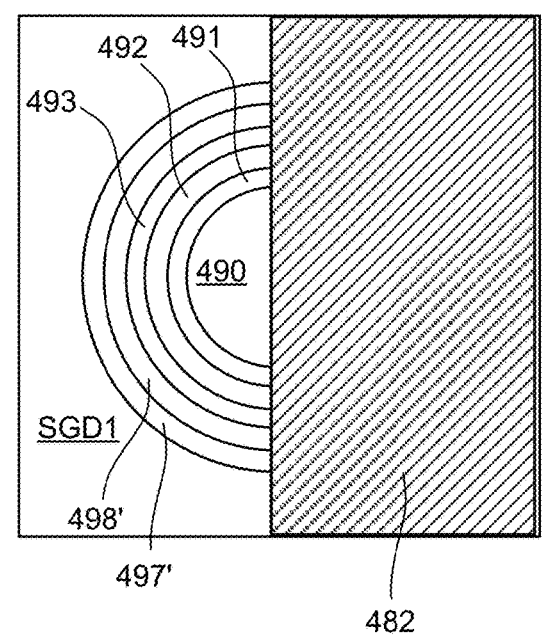
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
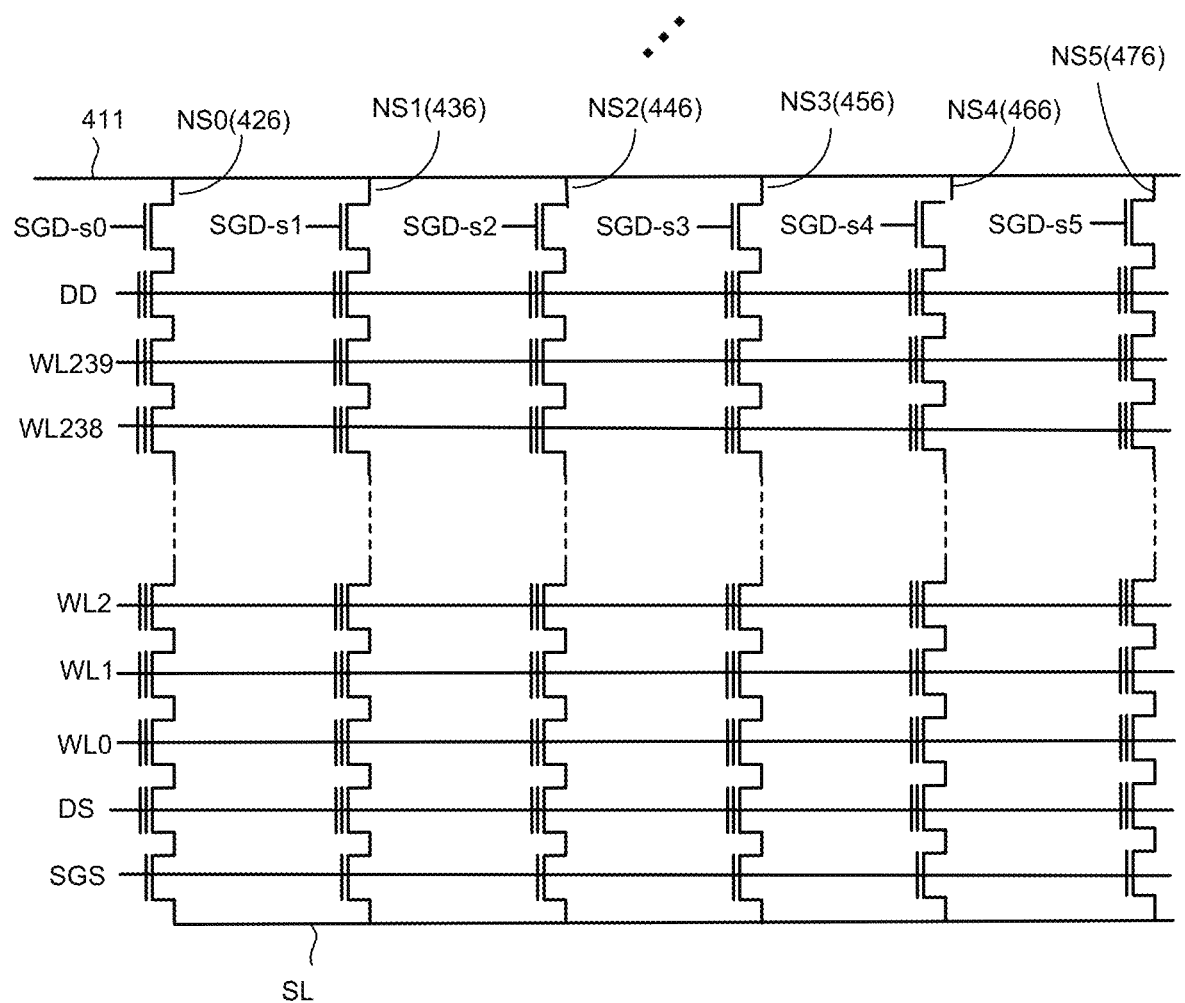
FIG. 4J is a schematic of a plurality of NAND strings.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of the above-described regions. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
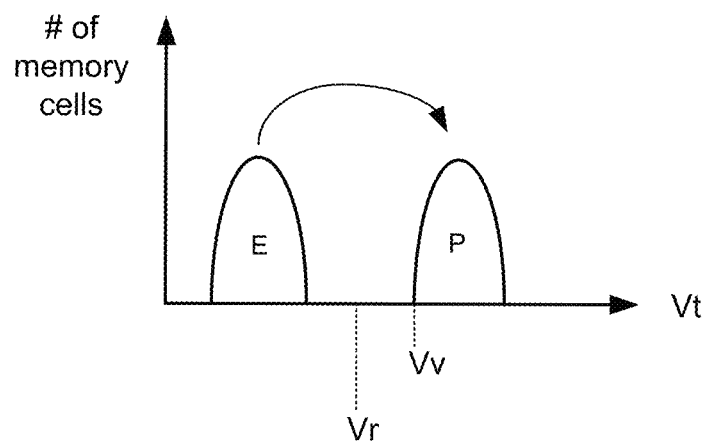
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
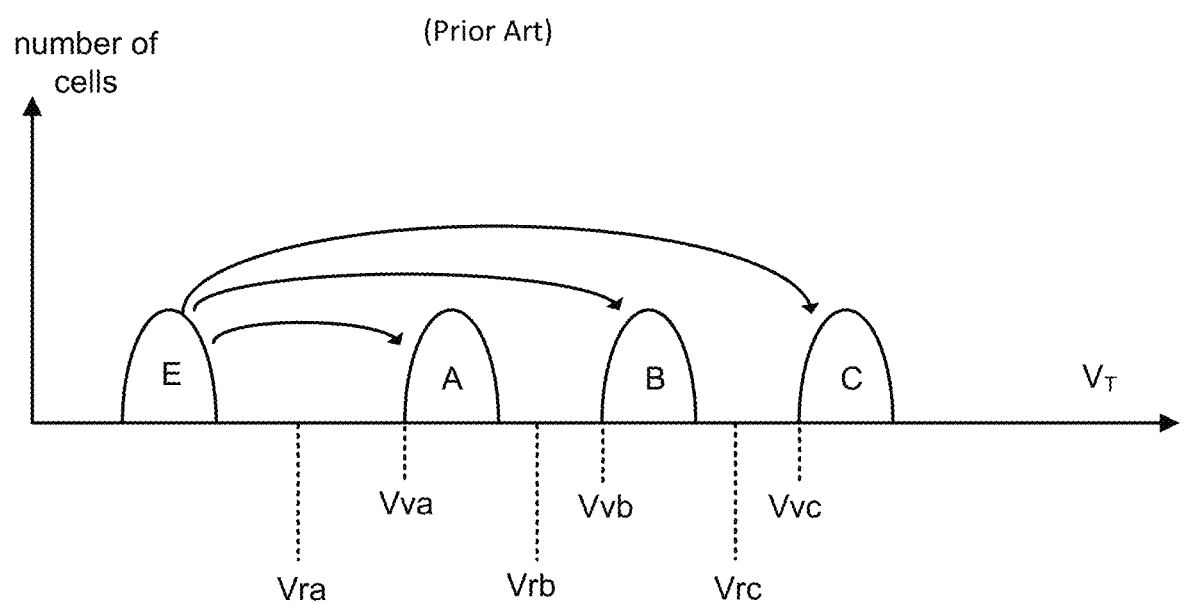
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
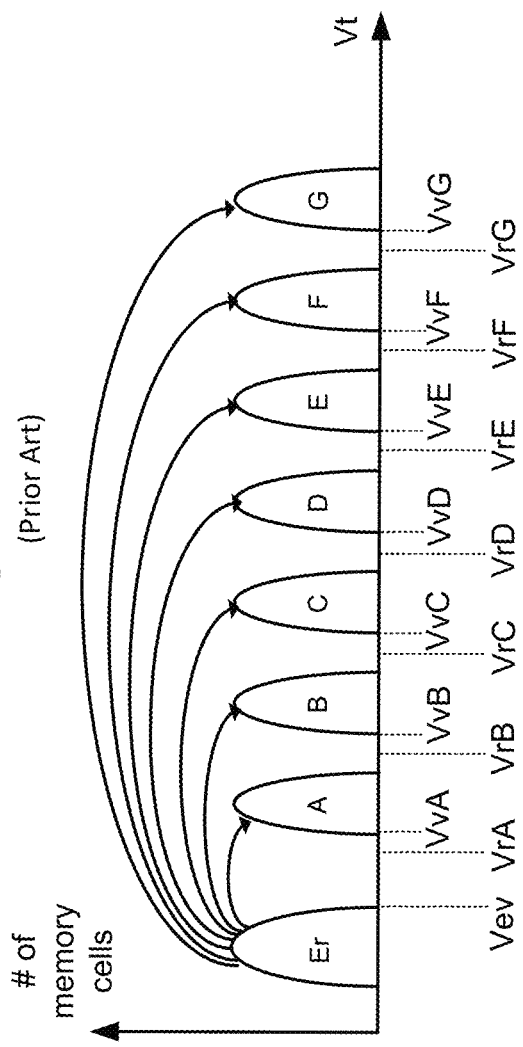
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
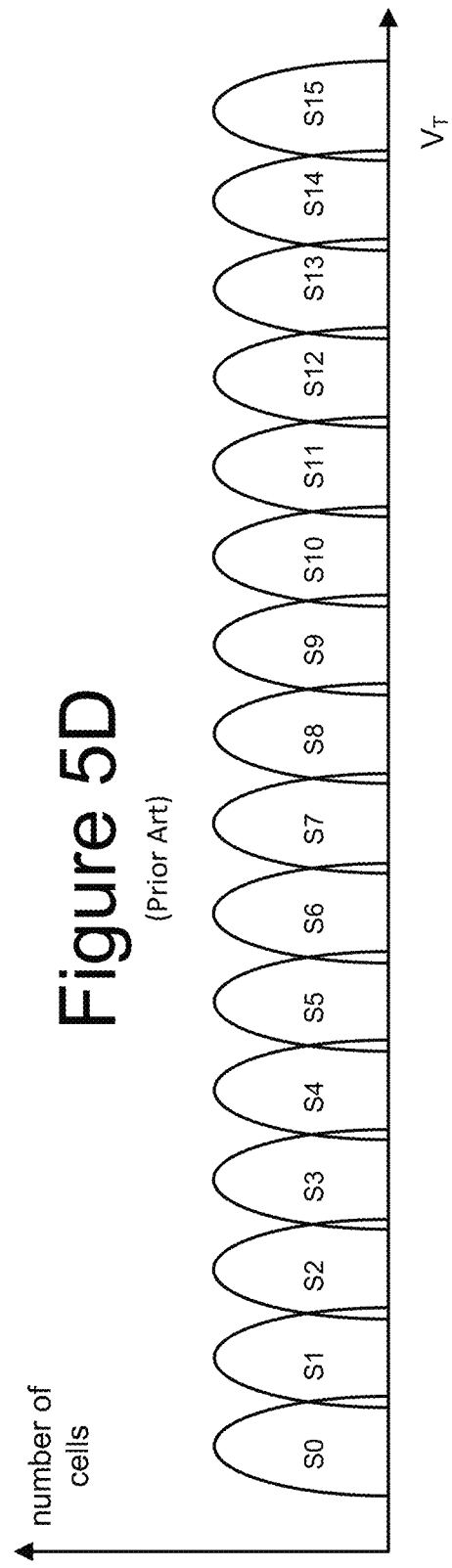
FIG. 5D depicts threshold voltage distributions.
Figure 5E:
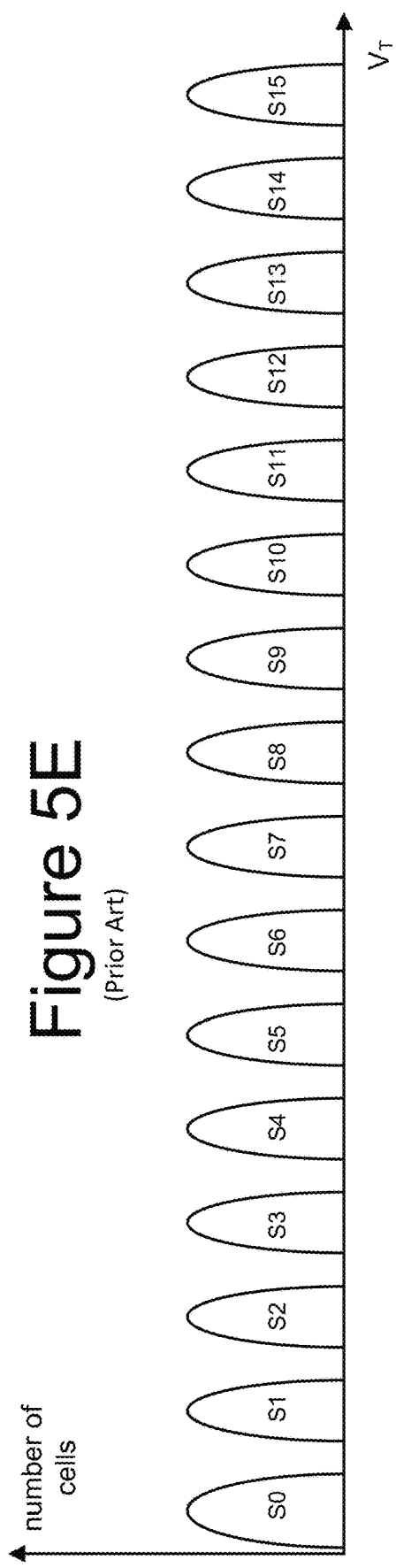
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
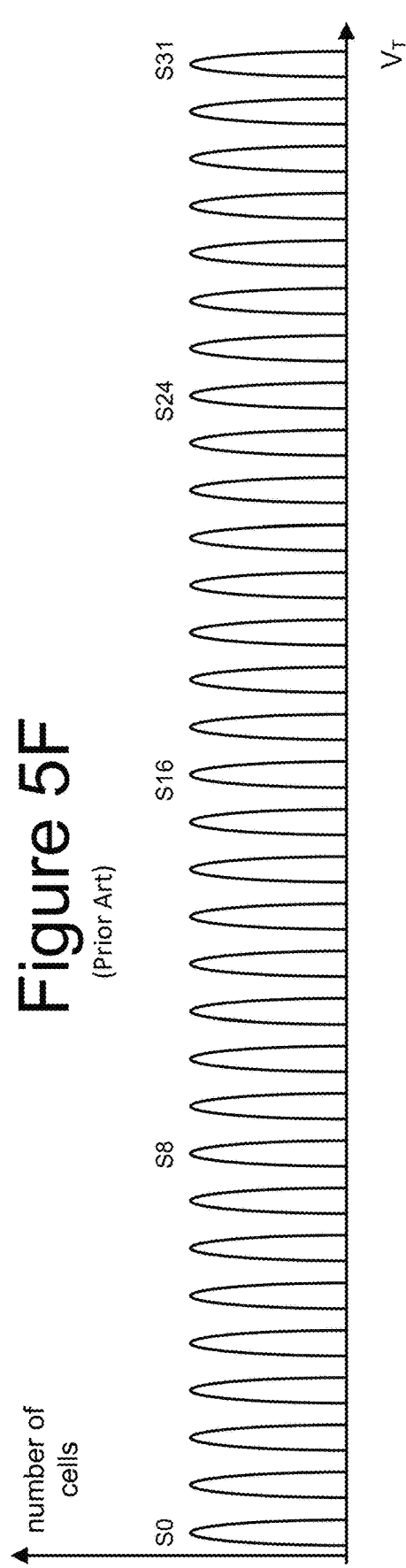
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
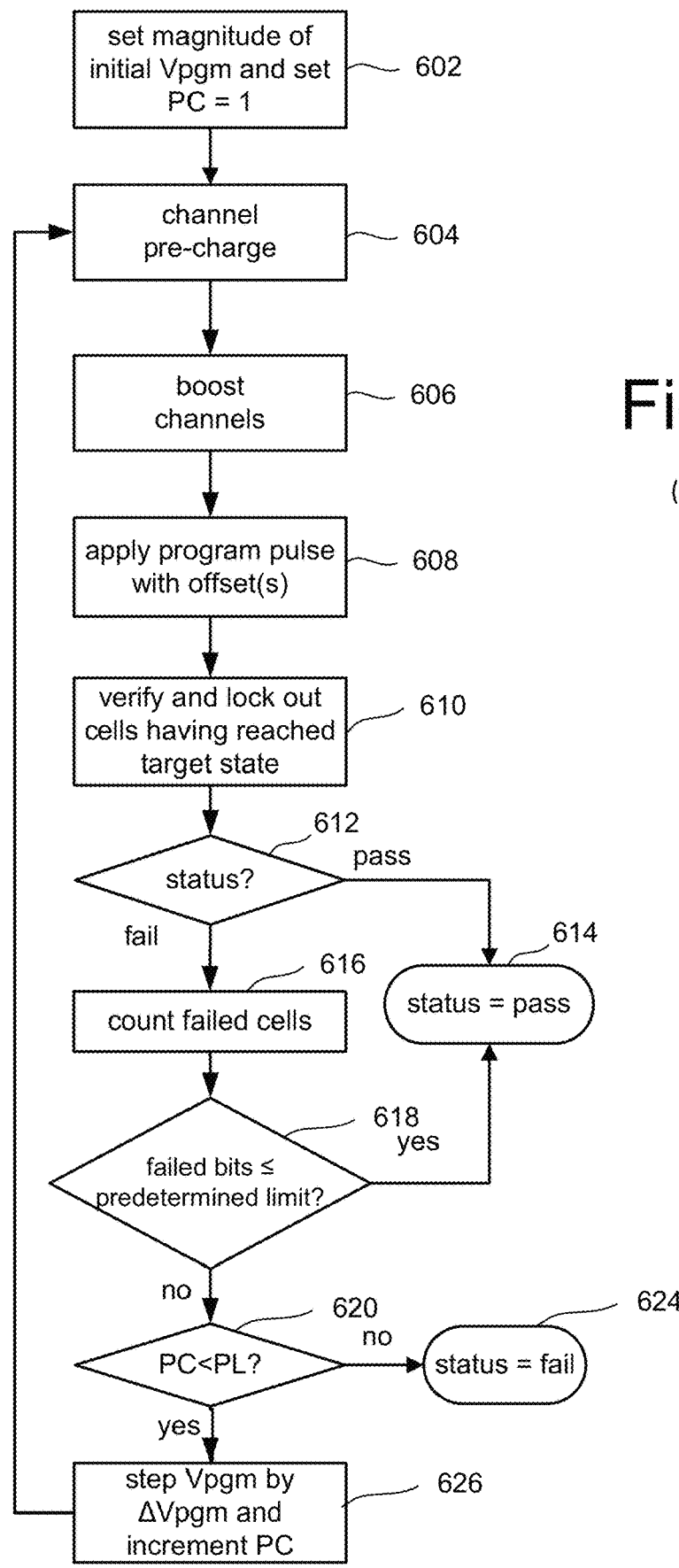
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size $\Delta$Vpgm (e.g., a step size of 0.1-1.0 volts). After step 626, the process loops back to step 604 and another program pulse is applied to the selected word line (by the control die) so that another loop (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
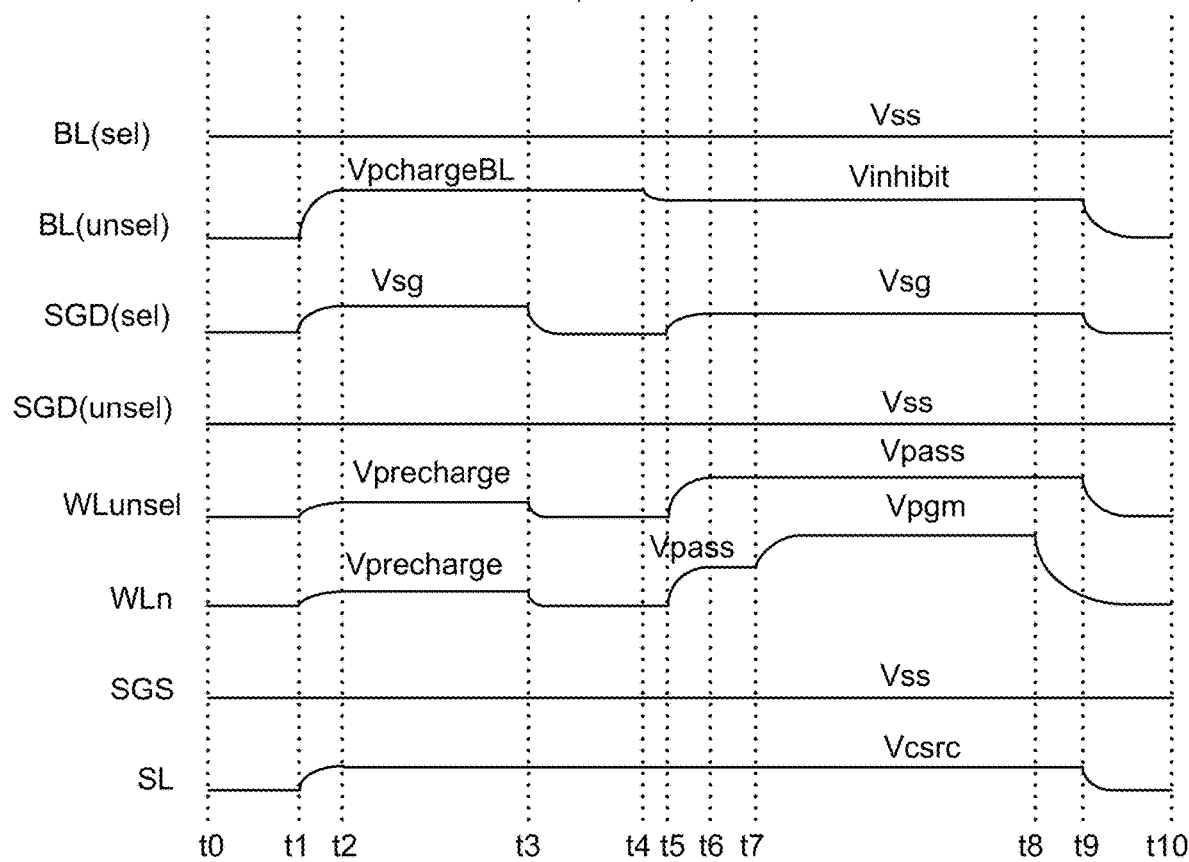
FIG. 7 is a signal timing diagram describing one embodiment of the programming process.

FIG. 7 is a signal diagram describing the behavior of various signals used to control the memory cells during programming. FIG. 7 describes one example implementation of steps 604-608 of FIG. 6 for the following signals: BL(sel), BL(unsel), SGD(sel), SGD(unsel), WLunsel, WLn, SGS, and SL. The signal BL(sel) is the bit line signal applied to bit lines of NAND strings selected to be being programmed. The signal BL(unsel) is the bit line signal applied to unselected bit lines. The signal SGD(sel) is the SGD selection line for the appropriate portion of the block that is selected for programming (see FIG. 4F). The signal SGD (unsel) is the SGD lines that are unselected for the portions of the block that are unselected (see FIG. 4J). The signal WLunsel are the unselected word lines, meaning the word lines that are not connected to memory cells selected for being programmed at this time. The signal WLn is the programming voltage signal being applied to selected word lines in the blocks being simultaneously programmed. The signal SGS represents all the source side selection line (see FIG. 4J). The signal SL is the source line signal.

The signal BL(sel) is kept at Vss or ground during the time period of FIG. 6. At time t1, BL(unsel) is raised from ground to a pre-charge voltage VpchargeBL in order to allow for pre-charging as per step 604 of FIG. 6. At time t4, the unselected bit line voltage BL(unsel) is lowered to Vinhibit and then the voltage is lowered down to ground at time t9. At time t1, SGD (sel) is raised to Vsg which is a voltage high enough to turn on the transistor for the select gate (e.g., 3.5 v). This allows unselected NAND strings to be pre-charged (step 604 of FIG. 6) and selected NAND strings to not be pre-charged. The voltage for SGD(sel) is lowered to ground at time t3, raised to Vsg at t5, and lowered to ground at t9. The SGD(unsel) signal is kept at ground or Vss the entire time period of FIG. 6. The unselected word lines WLunsel is raised to Vprecharge at time t1, lowered to ground at time t3, raised to Vpass (e.g., 7-10 v) at time t5, and lowered to ground at time t9. The signal WLunsel is set to Vprecharge in order to allow the pre-charging of step 604 of FIG. 6 and then raised to Vpass in order to allow the boosting of step 606 of FIG. 6. The signal WLn is raised to Vprecharge at time t1, lowered to ground to time t3, raised to Vpass at time t5, raised to Vpgm (the programming voltage) at time t7, and lowered down to ground at time t8. Note that the voltage on WLn between t7 and t8 represents the voltage pulse used for programming (step 608 of FIG. 6). SGS is kept at Vss or ground during the time period of FIG. 6. The source line is raised from ground to Vcsrc (e.g., 2.5-3.5 volts) at time t1 and then lowered to ground at time t9. The time period of t2-t3 corresponds to the pre-charging of the channels of unselected NAND strings as per step 604 of FIG. 6.

As described above, one embodiment of a memory structure includes NAND strings that are formed by filling the memory holes with materials including a charge-trapping material to create vertical columns of materials that form the memory cells (also referred to as a memory column). For example, FIG. 4F depicts a cross sections of vertical column 472. FIGS. 4C-4F shows the vertical column in the shape of a cylinder with perfectly vertical sides. However, in some implementations, the vertical columns have sides that are angled. That is, the vertical columns increase in diameter along the vertical axis from bottom to top. For the embodiments that have lower sets of word lines below the Joint area and upper sets of word lines above the Joint area (see FIG. 4C), then the plurality of vertical columns increase in diameter along the vertical axis from bottom to top within a sub-block. This situation is graphically depicted in FIG. 8, which shows vertical column 472 divided into a lower memory column 804 and an upper memory column 802, both of which have sides that are angled such that the column increases in diameter along the vertical axis from bottom to top within a sub-block. The diameter of the lower memory column 804 is larger at the top as compared to the bottom within sub-block SB0. The diameter of the upper memory column 802 is larger at the top as compared to the bottom within sub-block SB1.

One step in the process flow to manufacture the memory is the memory hole etch, which defines the lateral shape of the memory cell. Ideally, the etch would be perfectly vertical. However, in reality for some embodiments, the etch is angled. This means that lower layers tend to have memory cells with smaller diameters. It has been observed that memory cells with smaller diameters program faster than memory cells with larger diameters. Therefore, as programming progresses from the lowest physical word line WL0 to the highest physical word line WL119 of the lower vertical column, the programming speed slows down. This pattern of faster to slower repeats when programming memory cells connected to word lines WL120-WL239. To speed up the slower memory cells on higher word lines, a programing voltage with a higher voltage magnitude (e.g., higher initial Vpgm) can be used.

Figure 8:
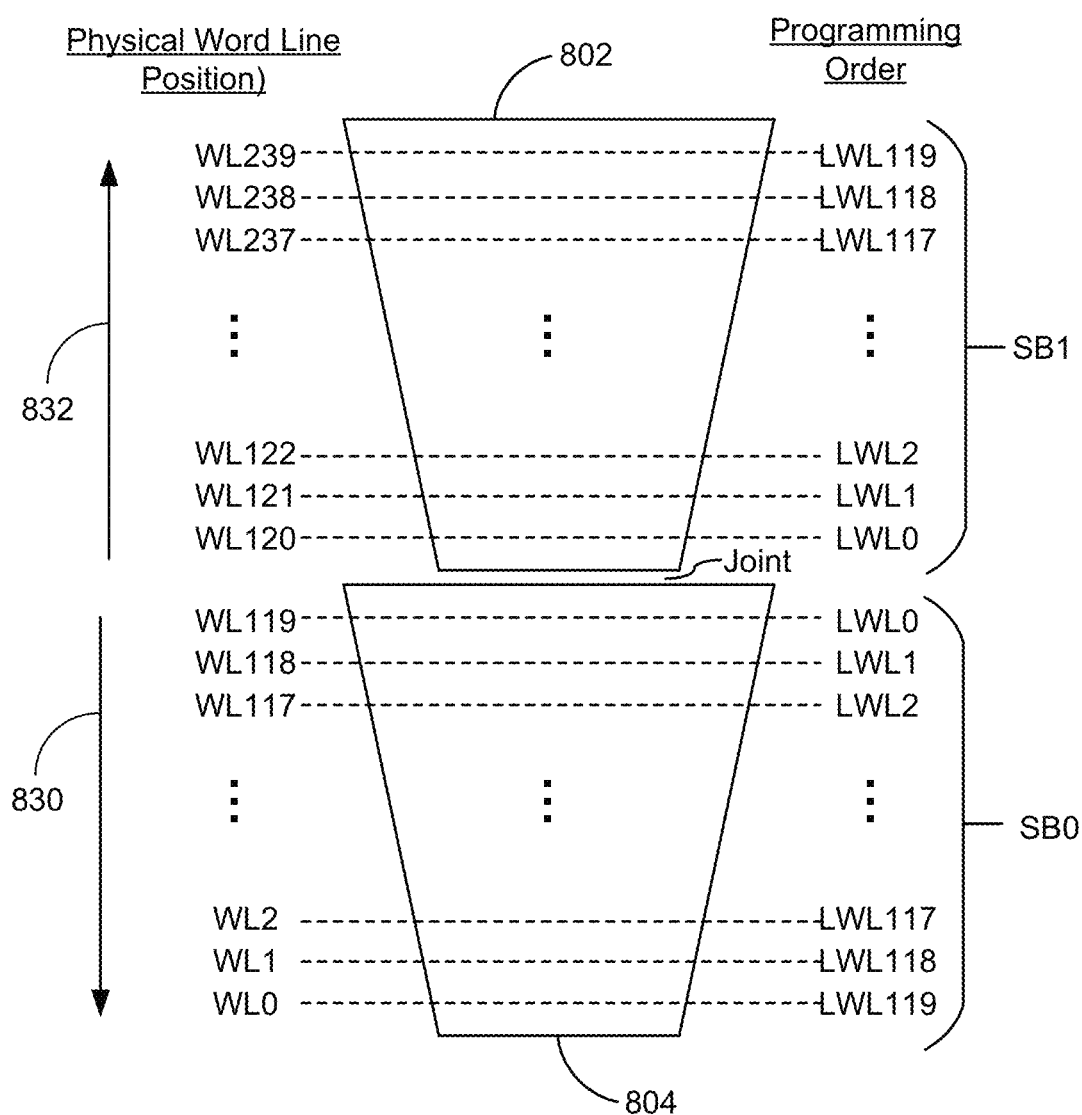
FIG. 8 is a block diagram depicting a vertical column that spans two sub-blocks and has its diameter increase from bottom of the vertical column to top of the vertical column within the sub-blocks.

In the past, memory systems typically erase an entire block before the block can be programmed. For more efficient usage, the memory system is logically divided into two or more sub-blocks. Then, each sub-block can be erased, read and programmed independently. In one embodiment, the blocks are divided into two sub-blocks: a lower sub-block SB0 and an upper sub-block SB1. In one embodiment, the lower sub-block SB0 includes all of the word lines below the Joint area and all of the memory cells connected to those word lines. In one embodiment, the upper sub-block SB1 includes all of the word lines above the Joint area and all of the memory cells connected to those word lines. FIG. 8 shows the vertical column with physical word lines WL0-WL239 divided into the lower sub-block SB0 (including WL0-WL119) and the upper sub-block SB1 (including WL120-WL239). In one embodiment, each sub-block of a block has a non-intersecting set of word lines as compared to other sub-blocks of the block. That is, the word lines in one sub-block are not also in another sub-block of the same block. In some embodiments, each NAND string is located in multiple sub-blocks of a same block.

In order to achieve better reliability, the programming order for programming sub-blocks starts in the middle and extends outward in the directions of arrows 830 and 832. This allows for better pre-charging and boosting during the programming process. The left side of FIG. 8 labels the word lines in physical order (physical word line number), indicating word line position from WL0 at the bottom to WL239 at the top while the right side of FIG. 8 labels the word lines in logical programming order/sequence for each sub-block starting in the middle at LWL0 for each sub-block SB0/SB1 and extending outward to LWL119 for each sub-block. Thus, the number following LWL represents the sequence number for programming (e.g., 117 is the sequence number for LWL117).

The sub-block arrangement of FIG. 8 allows for the erasing of half of the block's word lines, while maintaining the data in the memory cells connected to the other half of the block's word lines.

In multi-plane programming, two or more planes are programmed at the same time. For example, one block from a first plane is programmed concurrently with the programming of a block from a second plane. In one situation, the programming is performed on the same word line and in the same sub-block in both planes. For example, both planes can be programming logical word line LWL2 of the lower sub-block SB0.

In another embodiment, the system may program different word lines in different sub-blocks in different blocks of the different planes. For example, the first plane may receive programming for memory cells connected to logical word line LWL2 of the lower sub-block SB0 of a selected block while the second plane may receive programming for memory cells connected to logical word line LWL2 of the upper sub-block SB1 of a selected block in the second plane. The two logical word lines are different word lines because they are different physical word lines. This situation is depicted in FIG. 9.

Figure 9:
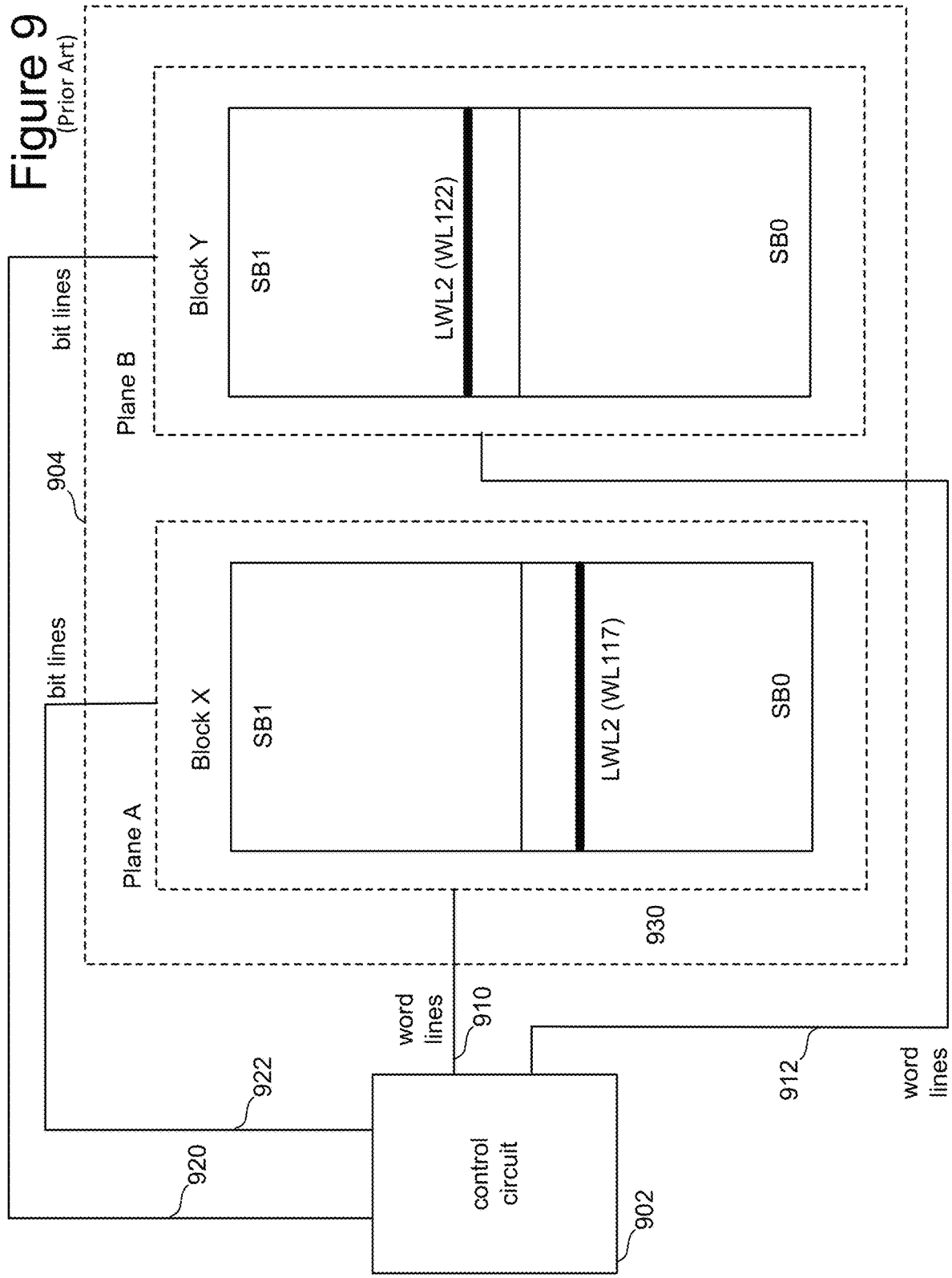
FIG. 9 is a block diagram of one or more control circuits connected to a non-volatile memory structure comprising multiple planes, each plane having multiple blocks, and each block having multiple sub-blocks.

FIG. 9 depicts a control circuit 902 connected to a memory structure 904 that includes two planes: Plane A and Plane B. In one embodiment, memory structure 904 is the memory structure 202 of FIGS. 2A/B. In other embodiments, memory structure 904 may include more than two planes (e.g., four planes or more). Although Planes A and B have many blocks, only Block X of Plane A and Block Y of Plane B are depicted to make the drawing easier to read. Block X and Block Y each have two sub-blocks: SB0 and SB1. Word lines 910 connect from control circuit 902 to Block X of Plane A. Word lines 912 connect from control circuit 902 to Block Y of Plane B. Bit lines 922 connect from control circuit 902 to Block X of Plane A. Bit lines 920 connect from control circuit 902 to Block Y of Plane B. In one embodiment, control circuit 902 includes column control circuitry 210, row control circuitry 220 and/or system control logic 260, as described above with respect to FIGS. 2A/B. In other embodiments, other circuits that support and operate on memory structure 904 can be used as the control circuit. For example, in some embodiments, the memory controller can operate as the control circuit 902 or can be part of the control circuit 902. Control circuit 902 can also be implemented as a microprocessor, microcontroller or other type of processor that is hardwired or programmed to perform the functions described herein.

In the example of FIG. 9, control circuit 902 is configured to simultaneously program memory cells connected to different word lines that are in different sub-blocks of different blocks in different planes of a same die. For example, FIG. 9 shows the simultaneous programming of memory cells connected to LWL2 (WL117) of sub-block SB0 of block X of Plane A and memory cells connected to LWL2 (WL122) of sub-block SB1 of block Y of Plane B. The ability to independently erase, read and program sub-blocks allows for more efficient use of the memory system's storage capacity.

When programming memory cells to different word lines that are in different sub-blocks of different blocks in different planes of a die, each of the word lines needs to receive a programming voltage signal Vpgm (see FIG. 6). Because the word lines are in different sub-blocks of different blocks (and likely to be at different word line positions), it is likely that one of the word lines will program faster than the other word line due to the different word line position. Looking back at FIG. 8, word lines at different word line positions may connect to or intersect the vertical columns at portions of the vertical columns with different diameters, thereby, connecting to memory cells that program at different speeds. If each plane could receive different programming voltage signals, then the word line intersecting the vertical column at a smaller diameter could receive a programming voltage signal at a lower voltage magnitude then the word line intersecting the vertical column at the larger diameter. However, in the embodiments of the memory systems described herein all word lines of all blocks of all planes receive the same programming voltage signal. Therefore, it is proposed to modify a standard programming voltage signal by one or more offsets that are customized for the group of word lines in different planes that are being programmed concurrently. The offsets can include offsets to voltage magnitude and/or pulse width of the programming voltage signal. In some embodiments, the period of time for performing the pre-charge (e.g., t2-t3 of FIG. 7 and step 604 of FIG. 6) can also be adjusted.

Figure 10:
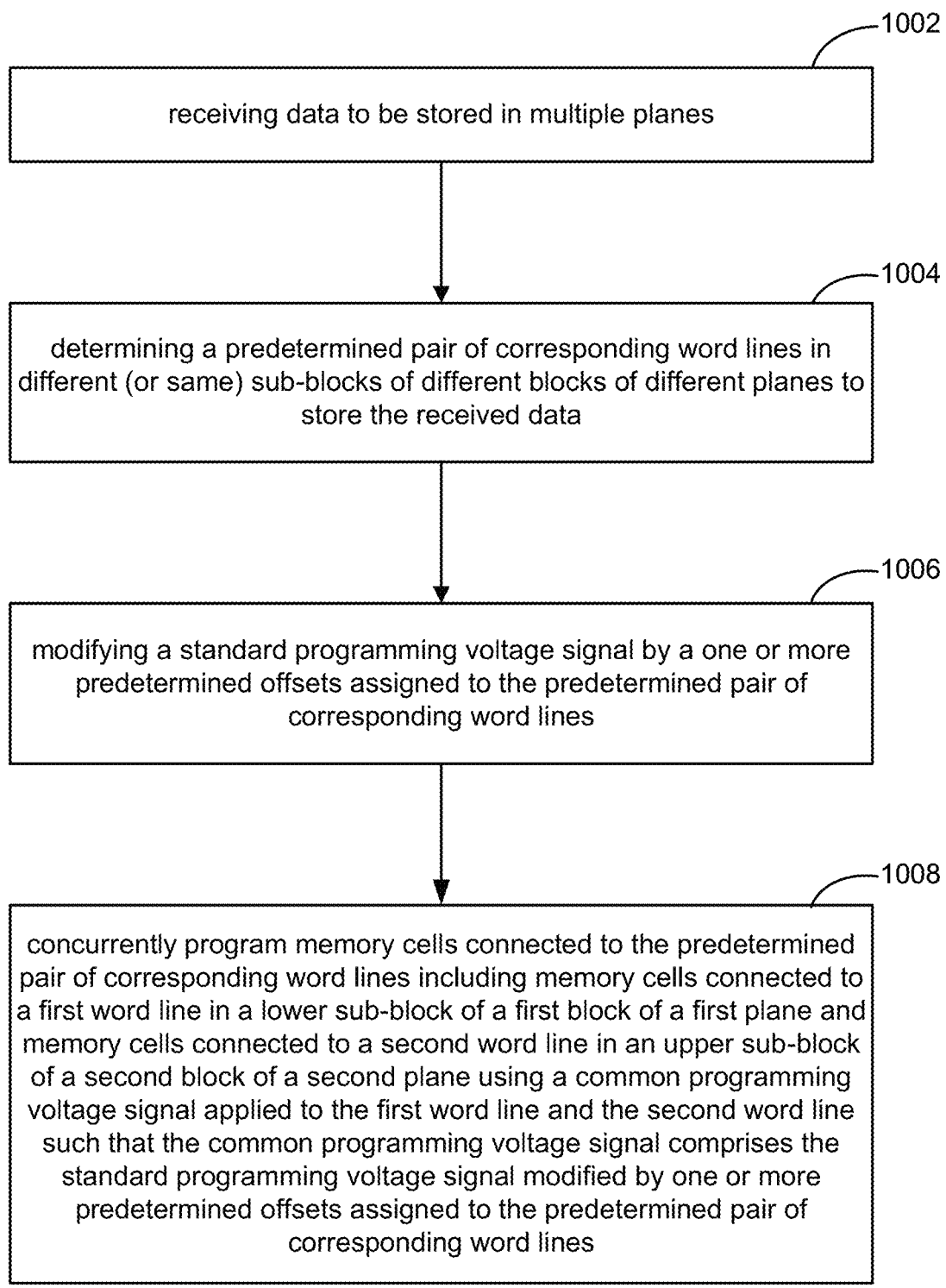
FIG. 10 is a flow chart describing one embodiment of a process for concurrently programming memory cells connected to different word lines in different sub-blocks of different blocks in different planes.

FIG. 10 is a flow chart describing one embodiment of a process for concurrently programming memory cells connected to different word lines in different sub-blocks of different blocks in different planes (see e.g., FIG. 9) that includes using a standard programming voltage signal that us modified by one or more offsets that are customized for the group of word lines in different planes that are being programmed concurrently. In one example embodiment, the process of FIG. 10 is performed by any of the embodiments of one or more control circuits discussed above. In one example embodiment, the process of FIG. 10 is performed by integrated memory assembly 207 using any of the embodiments of the one or more control circuits discussed above of control die 211. In one embodiment, the process of FIG. 10 is performed at the direction of state machine 262 (or another processor). In one embodiment, the process of FIG. 10 is performed at the direction of (or by) memory controller 120 connected to multiple memory die and/or multiple integrated assemblies.

In one embodiment, the process of FIG. 10 is performed by one or more control circuits connected to multiple planes of non-volatile memory cells, where each plane comprises word lines and blocks of non-volatile memory cells. Each block comprises sub-blocks including an upper sub-block and a lower sub-block. The word lines are grouped into predetermined pairs of corresponding word lines such that a predetermined pair of corresponding word lines comprises a word line of a lower sub-block (e.g., WL117 of FIG. 9) and a word line of an upper sub-block (e.g., WL 122 of FIG. 9). Each predetermined pair of corresponding word lines is assigned a predetermined offset.

In step 1002 of FIG. 10, data is received. For example, data is received at a memory die, at a control die or an integrated memory assembly and/or at a memory controller. The received data is to be concurrently programmed into memory cells connected to different word lines in different sub-blocks of different blocks in different planes. In step 1004, the one or more control circuits determine a predetermined pair of corresponding word lines in different (or same) sub-blocks of different blocks of different planes to store the received data. In other embodiments, the one or more control circuits determine a predetermined group of corresponding word lines that includes more than two word lines so that data is concurrently programmed in more than two planes. In step 1006, the one or more control circuits modify a standard programming voltage signal by a one or more predetermined offsets assigned to the predetermined pair of corresponding word lines. For example, one embodiment of a standard programming voltage signal has an initial voltage magnitude of 12-20 volts, increases the voltage magnitude by 0.7 volts for each successive voltage pulse and has a pulse width of 15-20 micro seconds. Step 1006 includes determining one or more offsets to the standard programming voltage signal to optimize programming for the word lines selected in step 1004. More details about the offsets are provided below.

In step 1008, the one or more control circuits concurrently program memory cells connected to a first predetermined pair of corresponding word lines including memory cells connected to a first word line in a lower sub-block of a first block of a first plane and memory cells connected to a second word line in an upper sub-block of a second block of a second plane using a common programming voltage signal applied to the first word line and the second word line such that the common programming voltage signal comprises a standard programming voltage signal modified by a first predetermined offset assigned to the first predetermined pair of corresponding word lines.

Figure 11:
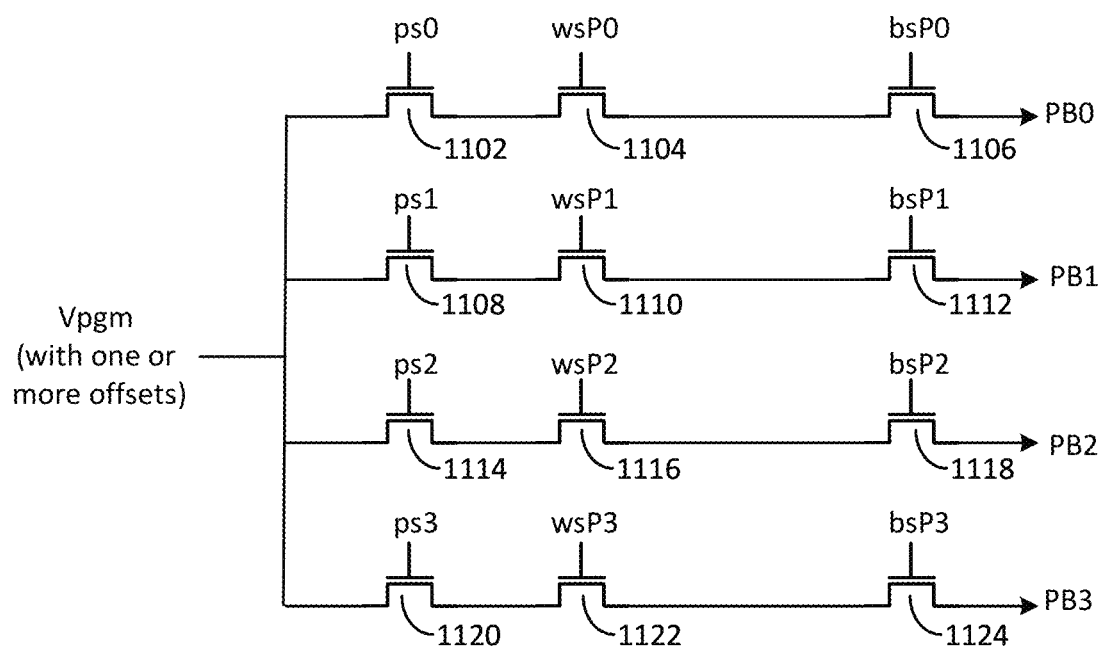
FIG. 11 is a circuit diagram depicting an example of applying a common programming voltage signal to different word lines in different sub-blocks of different blocks in different planes.

As mentioned above, each of the word lines selected for programming will receive the same programming voltage signal Vpgm. FIG. 11 is a circuit diagram depicting an example of a circuit that applies a common programming voltage signal Vpgm to different word lines in different sub-blocks of different blocks in different planes (PB0, PB1, PB2 and PB3). FIG. 11 shows the common programming voltage signal Vpgm being applied to transistors 1102, 1108, 1114 and 1120, which also receive selection signals ps0, ps1, ps2 and ps3, respectively, for selecting a plane. The outputs of transistors 1102, 1108, 1114 and 1120 are provided to transistors 1104, 1110, 1116 and 1122, respectively. Transistors 1104, 1110, 1116 and 1122 also receive selection signals wsP0, wsP1, wsP2 and wsP3, respectively, for selecting a word line. The outputs of transistors 1104, 1110, 1116 and 1122 are provided to transistors 1106, 1112, 1118 and 1124. Transistors 1106, 1112, 1118 and 1124 also receive selection signals bsP0, bsP1, bsP2 and bsP3, respectively, for selecting a block in the respective plane. In this manner, the same programming voltage is concurrently applied to memory cells being concurrently programmed that are connected to different word lines in different sub-blocks of different blocks in different planes.

Figure 12:
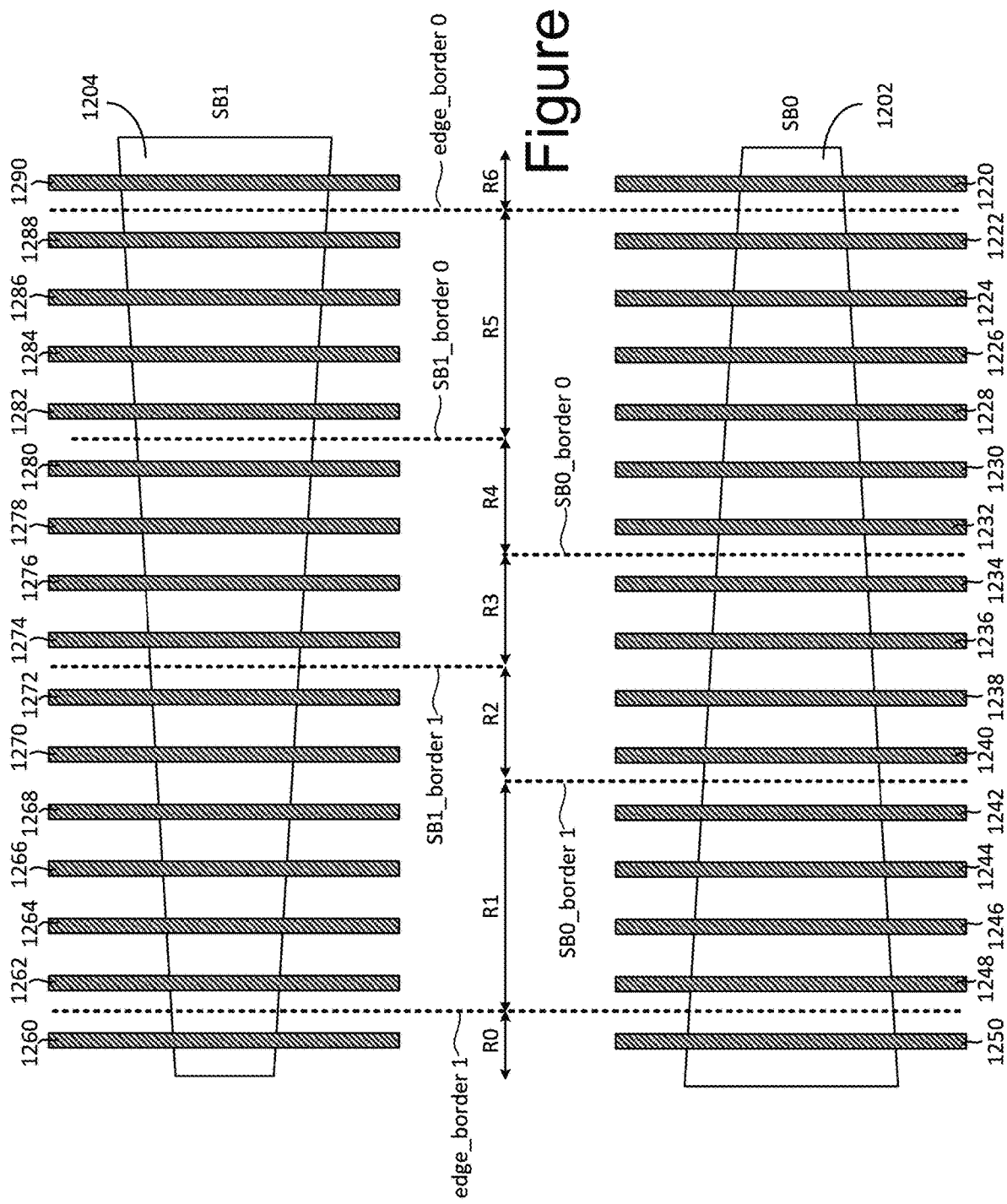
FIG. 12 depicts portions of vertical columns, and describes zones and offset regions for the vertical columns.

As mentioned above, vertical columns can be divided into a lower memory column (in a lower sub-block) and an upper memory column (in an upper sub-block), both of which have sides that are angled such that the column increases in diameter along the vertical axis from bottom to top within a sub-block. FIG. 12 depicts a lower memory column 1202 (in a lower sub-block SB0), an upper memory column 1204 (in an upper sub-block SB1) and word lines 1220-1290 for the vertical column being programmed using the process of FIG. 10; however, rather than showing the upper memory column above the lower memory column (as fabricated), FIG. 12 shows (for illustrative purposes only) the upper memory column 1204 next to the lower memory column 1202 in order to line up predetermined pairs of corresponding word lines.

In one embodiment, a block (including the lower sub-block and the upper sub-block) has 2N word lines, numbered 0 to 2N-1, and all predetermined pairs of corresponding word lines have physical word line numbers WLn and WLm such that m+n=2N-1. For example, looking back at FIG. 9, WL117 and WL122 are a predetermined pairs of corresponding word lines as 2N=2(120)=240, 2N-1=239 and 117+122=2(120)-1=239. Examples of predetermined pairs of corresponding word lines in the embodiment of FIG. 12 include 1220/1290, 1222/1288, 1224/1286, 1226/1284, 1228/1282, 1230/1280, 1232/1278, 1234/1276, 1236/1274, 1238/1272, 1240/1270, 1242/1268, 1244/1266, 1246/1264, 1248/1262, 1250/1260. In one example, upper memory column 1204 corresponds to upper memory column 802, lower memory column 1202 corresponds to lower memory column 804, word line 1220 corresponds to WL0, word line 1222 corresponds to WL1, word line 1224 corresponds to WL2, . . . , word line 1250 corresponds to WL119, word line 1260 corresponds to WL120, word line 1262 corresponds to WL121, . . . , word line 1290 corresponds to WL239.

In one embodiment, the vertical columns are divided into zones based on diameter such that each zone includes a contiguous set of word lines within a single range of diameters of the vertical columns. For example, in one embodiment the vertical column depicted in FIG. 12 is divided into the following ten zones: (1) a first zone comprising word line 1220; (2) a second zone comprising word lines 1222-1232; (3) a third zone comprising word lines 1234-1240; (4) a fourth zone comprising word lines 1242-1248; (5) a fifth zone comprising word line 1250; (6) a sixth zone comprising word line 1260; (7) a seventh zone comprising word lines 1262-1272; (8) an eight zone comprising word lines 1274-1280; (9) a ninth zone comprising word lines 1282-1288; and (10) as tenth zone comprising word line 1290. The zones are separated by edge_border 0, edge_border 1, SB0_border 0; SB0_border1; SB1_border 0; and SB1_border1. In one embodiment, as depicted in FIG. 12, the zones are non-overlapping.

Each block includes a set of offset regions. Each offset region includes one or more pairs of corresponding word lines such that each word line of the respective offset region that is in an upper sub-block is in a same zone and each word line of the respective offset region that is in a lower sub-block is in a same zone. For example, in one embodiment the vertical column depicted in FIG. 12 is divided into the following seven offset regions: (1) offset region R0 comprising word lines 1250 and 1260; (2) offset region R1 comprising word lines 1242-1248 and 1262-1268; (3) offset region R2 comprising word lines 1238, 1240, 1270 and 1272; (4) offset region R3 comprising word lines 1234, 1236, 1274 and 1276; (5) offset region R4 comprising word lines 1230, 1232, 1278 and 1280; (6) offset region R5 comprising word lines 1222-1228 and 1282-1288; and (7) offset region R6 comprising word lines 1220 and 1290. In one embodiment, as depicted in FIG. 12, the offset regions are non-overlapping.

Each offset region is associated with one or more predetermined offsets (e.g., voltage magnitude and/or pulse width). FIG. 13 is a table that provides examples of predetermined offsets. The left most column of FIG. 13 indicates the offset region. The middle column provides an example offset (Vpgm offset) in voltage magnitude for each offset region. The right most column provides an example offset (PW offset) in pulse width for each offset region. In one embodiment, each offset region is assigned a different predetermined offset from a set of predetermined offsets. In one embodiment, each offset region is capable of being assigned a different predetermined offset of the set of predetermined offsets but some may share the same offset. In some embodiments, the one or more control circuits are configured to store separate and independent predetermined offsets for each offset region. For example, FIG. 14 shows one example of how the control circuit stores/sets the amount of an offset in voltage magnitude (Vpgm offset) and FIG. 15 shows one example of how the control circuit stores/sets the amount of an offset in pulse width (PW offset).

In one embodiment, a table similar to the tables of FIGS. 14 and 15 is used to store/set an offset in pre-charge time. FIG. 16 includes a table depicting another embodiment where the control circuit chooses whether to use the nominal pre-charge time for the plane/word line with the minimal pre-charge time or the plane/word line with the maximum pre-charge time.

FIG. 17 is a flow chart describing another embodiment of a process for concurrently programming memory cells connected to different word lines in different sub-blocks of different blocks in different planes (see e.g., FIG. 9) that includes using a standard programming voltage signal that is modified by one or more offsets that are customized for the group of word lines in different planes that are being programmed concurrently. In one embodiment, the process of FIG. 17 is an example implementation of the process of FIG. 10 using the structures and arrangements of FIGS. 11-16. In one example embodiment, the process of FIG. 17 is performed by any of the embodiments of one or more control circuits discussed above. In one example embodiment, the process of FIG. 17 is performed by integrated memory assembly 207 using any of the embodiments of the one or more control circuits discussed above of control die 211. In one embodiment, the process of FIG. 17 is performed at the direction of state machine 262 (or another processor). In one embodiment, the process of FIG. 17 is performed at the direction of (or by) memory controller 120 connected to multiple memory die and/or multiple integrated assemblies.

In step 1702, the one or more control circuits receive data to be stored in multiple planes of non-volatile memory cells, each plane comprising blocks of non-volatile memory cells, each block comprises a stack of dielectric layers alternating with conductive layers and vertical columns of materials through the stack that form the memory cells, at least a subset of the conducting layers form 2N word lines, each block comprises sub-blocks including an upper sub-block and a lower sub-block, and the vertical columns have diameters that increase from bottom of the vertical columns to top of the vertical columns within the sub-blocks. In step 1704, the one or more control circuits connected to the non-volatile memory structure program memory cells of upper sub-blocks in a sequence from bottom word line to top word line such that word lines of upper sub-blocks have a sequence number based on when memory cells connected to the respective word line are programmed in the sequence from bottom word line to top word line. In step 1706, the one or more control circuits program memory cells of lower sub-blocks in a sequence from top word line to bottom word line such that word lines of lower sub-blocks have a sequence number based on when memory cells of the respective word line are programmed in the sequence from top word line to bottom word line.

In step 1708, the one or more control circuits determine an offset region for the data to be programmed in the multiple planes. Each word line of a lower sub-block has a corresponding word line of an upper sub-block that has a same sequence number such that a pair of corresponding word lines comprises a word line of a lower sub-block and a word line of an upper sub-block both having the same sequence number. The vertical columns are divided into zones based on diameter such that each zone includes a contiguous set of word lines within a single range of diameters of the vertical columns. Each block includes a set of offset regions. Each offset region includes one or more pairs of corresponding word lines such that each word line of the respective offset region that is in an upper sub-block is in a same zone and each word line of the respective offset region that is in a lower sub-block is in a same zone. Each offset region is associated with a program voltage offset and a program pulse width offset. In step 1710, the one or more control circuits concurrently program memory cells connected to a pair of corresponding word lines including WLn in a lower sub-block of first block of a first plane and WLm in an upper sub-block of second block in a second plane, such that m+n=2N-1, using a common programming voltage signal applied to WLn for the first block of the first plane and applied to WLm for the second block of the second plane that comprises a plurality of voltage pulses having a pulse width of a standard pulse width modified by a pulse width offset for an offset region that includes WLn and WLm and magnitudes of standard program signal magnitudes modified by a program voltage offset for the offset region that includes WLn and WLm In step 1717, the one or more control circuits are configured to pre-charge NAND strings connected to WLn in the lower sub-block of first block of the first plane and NAND strings connected to WLm in the upper sub-block of second block in the second plane for a time period equal to a standard pre-charge time period modified by a pre-charge offset for the offset region that includes WLn and WLm. In one embodiment, step 1717 is performed prior to step 1710 or as part of step 1710.

Figures 18, 20:
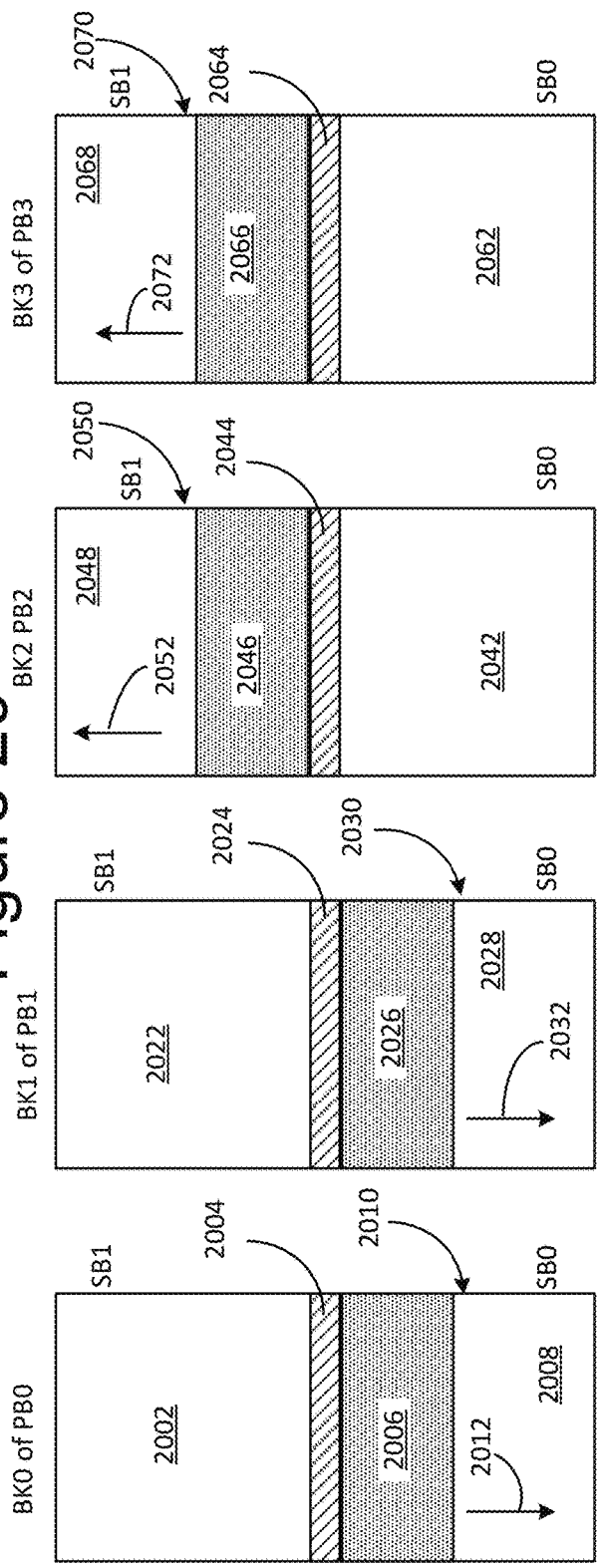
FIG. 18 depicts a sequence of commands.
FIG. 20 depicts four planes, and is an example of concurrently programming memory cells connected to different word lines in different sub-blocks of different blocks in different planes.

As discussed above with respect to FIGS. 1, 2A and 2B, there is an interface for communicating between Memory Interface 160 of Memory Controller 120 and Interface 268 of memory die 200 (or of control die 211). Using this interface, Memory Controller 120 can issue commands to the memory die or the integrated memory assembly in order to program data to, erase and/or read data from memory array 202. FIG. 18 depicts an example set of five lines (1800, 1802, 1804, 1806, 1808 and 1810) of commands and data communicated via the interface between Memory Interface 160 of Memory Controller 120 and Interface 268 of Memory Die 200 (or of control die 211) in order to concurrently program memory cells connected to different word lines in different sub-blocks of different blocks in different planes that includes using a standard programming voltage signal modified by one or more offsets that are customized for the group of word lines in different planes that are being programmed concurrently.

In line 1800, Memory Controller 120 sends the command ZZh-ADD(yyh)-Data(01h), which is used to enable the multi-plane concurrent sub-block programming mode discussed herein (e.g., FIGS. 10, 17 and 19). In line 1802, Memory Controller sends E3h to indicate sub-block mode, A2h to indicate SLC data (MLC data can also be used), 80h to indicate an address will be sent for the first plane, five clock cycles to send the address of where to program the data in the first plane PB0, followed by transferring the data to be programmed (Data in) for the first plane and then 11h to indicate the completion of the transfer of data for the first plane. In line 1804, Memory Controller sends E3h to indicate sub-block mode, A2h to indicate SLC data (MLC data can also be used), 80h to indicate an address will be sent for the second plane, then five clock cycles are used to send the address of where to program the data in the second plane PB1, followed by transferring the data to be programmed (Data in) for the second plane and then 11h to indicate the completion of the transfer of data for the second plane. In line 1806, Memory Controller sends E3h to indicate sub-block mode, A2h to indicate SLC data (MLC data can also be used), 80h to indicate an address will be sent for the third plane, then five clock cycles are used to send the address of where to program the data in the third plane PB2, followed by transferring the data to be programmed (Data in) for the third plane and then 11h to indicate the completion of the transfer of data for the first plane. In line 1808, Memory Controller sends E3h to indicate sub-block mode, A2h to indicate SLC data (MLC data can also be used), 80h to indicate an address will be sent for the fourth plane, then five clock cycles are used to send the address of where to program the data in the fourth plane PB3, followed by transferring the data to be programmed (Data in) for the fourth plane and then 10h to indicate the completion of the transfer of data for the fourth (and final) plane. In response to 10h, the memory die concurrently programs the transferred data into memory cells connected to different word lines in different sub-blocks of different blocks in the four planes that includes using a standard programming voltage signal modified by one or more offsets that are customized for the group of word lines in different planes that are being programmed concurrently.

After each of lines 1802-1808, the memory die first indicates that it is busy while it processes the command and then indicates it is ready for the next command. After the command of line 1808, the memory die (or integrated memory assembly) indicates that it is busy while it concurrently programs memory cells connected to different word lines in different sub-blocks of different blocks in the four planes that includes using a standard programming voltage signal modified by one or more offsets that are customized for the group of word lines in different planes that are being programmed concurrently. In line 1810, Memory Controller sends the command ZZh-ADD(yyh)-Data(00h), which is used to disable the multi-plane concurrent sub-block programming mode. The commands and data depicted in FIG. 18 are an example embodiment for the Memory Controller to invoke the processes of FIGS. 10 and 17 for four planes.

FIG. 19 is a flow chart describing another embodiment of a process for concurrently programming memory cells connected to different word lines in different sub-blocks of different blocks in different planes (see e.g., FIG. 9) that includes using a standard programming voltage signal that is modified by one or more offsets that are customized for the group of word lines in different planes that are being programmed concurrently. In one embodiment, the process of FIG. 19 is an example implementation of the process of FIG. 10 using the structures and arrangements of FIGS. 11-16. In one example embodiment, the process of FIG. 19 is performed by any of the embodiments of one or more control circuits discussed above. In one example embodiment, the process of FIG. 19 is performed by integrated memory assembly 207 using any of the embodiments of the one or more control circuits discussed above of control die 211. In one embodiment, the process of FIG. 19 is performed at the direction of state machine 262 (or another processor). In one embodiment, the process of FIG. 19 is performed at the direction of (or by) memory controller 120 connected to multiple memory die and/or multiple integrated assemblies. In one embodiment, the commands and data depicted in FIG. 18 are an example embodiment for the Memory Controller to invoke the processes of FIG. 19.

In one embodiment, the method of FIG. 19 includes a process for operating non-volatile storage comprising multiple planes of non-volatile memory cells including a first plane and a second plane. Each plane comprises blocks of non-volatile memory cells. Each block comprises a stack of dielectric layers alternating with conductive layers and vertical columns of materials through the stack that form the memory cells. Each block comprises sub-blocks including an upper sub-block and a lower sub-block. The vertical columns have diameters that increase from bottom of the vertical columns to top of the vertical columns within the sub-blocks. In step 1902 of FIG. 19, the one or more control circuits receive first data to be stored in a first plane. In step 1904, the one or more control circuits receive a first address for the first data. The first address corresponds to a first set of memory cells connected a first word line in a lower sub-block of a first block in the first plane. The first word line intersects vertical columns at a first range of one or more column diameters (e.g., see FIG. 12 and the discussion of zones). In step 1906, the one or more control circuits receive second data separately from the first data. The second data is to be stored in a second plane. In an embodiment with more than two planes, additional sets of data can be received. For example, in an embodiment with four planes, the process of FIG. 19 will include receiving third data to store in a third plane and fourth data to store in a fourth plane. In step 1908, the one or more control circuits receive a second address for the second data. The second address corresponds to a second set of memory cells connected to a second word line in an upper sub-block of a second block in the second plane. The second word line intersects columns at a second range of one or more column diameters. The first range of one or more column diameters is different than and disjoint from the second range of one or more column diameter. In step 1910, the one or more control circuits concurrently program the first data to the first set of memory cells and the second data to the second set of memory cells by concurrently applying a common programming signal to the first word line and the second word line such that the common programming signal comprises a standard programming signal modified by a offset assigned to both the first word line and the second word line based on the first range of one or more column diameters and the second range of one or more column diameters, as discussed above with respect to FIGS. 13-16.

FIG. 20 is a block diagram of an exemplary scenario of a four plane architecture that depicts four blocks of memory cells, with each of the four blocks being in a different plane, and illustrates how data is concurrently programmed into memory cells connected to different word lines in different sub-blocks of different blocks in different planes using a standard programming voltage signal that is modified by one or more offsets that are customized for the group of word lines in different planes that are being programmed concurrently. In regard to the four blocks depicted, block BK0 is in plane PB0, block BK1 is in plane PB1, block BK2 is in plane PB2 and block BK3 is in plane PB3. Each of the four blocks depicted includes a first (lower) sub-block SB0 separated from a second (upper) sub-block SB1 by a joint area (2004, 2024, 2044, 2064)

For block BK0 of PB0, the upper sub-block 2002 (SB1) is erased, a first portion 2006 of the lower sub-block (SB0) is programmed, and a second portion 2008 of the lower sub-block (SB0) is erased but is in the process of being programmed with data in the order/direction of arrow 2012 with the word line 2010 being the word line currently undergoing programming (i.e. memory cells connected to word line 2010 are currently being programmed).

For block BK1 of PB1, the upper sub-block 2022 (SB1) is erased, a first portion 2026 of the lower sub-block (SB0) is programmed, and a second portion 2028 of the lower sub-block (SB0) is erased but is in the process of being programmed with data in the order/direction of arrow 2032 with the word line 2030 currently being programmed (ie memory cells connected to word line 2030 currently being programmed).

For block BK2 of PB2, the lower sub-block 2042 (SB0) is erased, a first portion 2046 of the upper sub-block (SB1) is programmed, and a second portion 2048 of the upper sub-block (SB1) is erased but is in the process of being programmed with data in the order/direction of arrow 2052 with the word line 2050 currently being programmed (ie memory cells connected to word line 2050 currently being programmed).

For block BK3 of PB3, the lower sub-block 2062 (SB0) is erased, a first portion 2066 of the upper sub-block (SB1) is programmed, and a second portion 2068 of the upper sub-block (SB1) is erased but is in the process of being programmed with data in the order/direction of arrow 2072 with the word line 2070 currently being programmed (ie memory cells connected to word line 2070 currently being programmed).

In the example of FIG. 20, data is concurrently programmed into the lower sub-block SB0 of block BK0, the lower sub-block SB0 of block BK1, the upper sub-block SB1 of block BK2 and the upper sub-block SB1 of block BK3.

In one embodiment, the multi-plane concurrent sub-block programming mode can be turned on and/or off. When multi-plane concurrent sub-block programming mode is tuned off, the system can program one plane at a time. When multi-plane concurrent sub-block programming mode is turned on, the system can concurrently program multiple planes as discussed above.

A non-volatile memory system has been described that concurrently programs memory cells connected to different word lines in different sub-blocks of different blocks in different planes.

One embodiment includes a non-volatile storage apparatus, comprising: multiple planes of non-volatile memory cells, each plane comprises word lines and blocks of non-volatile memory cells, each block comprises sub-blocks including an upper sub-block and a lower sub-block, the word lines are grouped into predetermined pairs of corresponding word lines such that a predetermined pair of corresponding word lines comprises a word line of a lower sub-block and a word line of an upper sub-block, each predetermined pair of corresponding word lines is assigned a predetermined offset; and one or more control circuits connected to the multiple planes, the one or more control circuits are configured to concurrently program memory cells connected to a first predetermined pair of corresponding word lines including memory cells connected to a first word line in a lower sub-block of a first block of a first plane and memory cells connected to a second word line in an upper sub-block of a second block of a second plane using a common programming voltage signal applied to the first word line and the second word line such that the common programming voltage signal comprises a standard programming voltage signal modified by a first predetermined offset assigned to the first predetermined pair of corresponding word lines.

In one example implementation: each of the blocks comprises a lower set of conductive layers and an upper set of conductive layers separated by a joint area that together form a plurality of word lines connected to a plurality of vertical columns that form the memory cells, each lower sub-block of a block has a non-intersecting set of word lines as compared to the upper sub-block of the block, the lower sub-block comprises the lower set of conductive layers, the upper sub-block comprises the upper set of conductive layers, the vertical columns have diameters that increase from bottom of the vertical columns to top of the vertical columns within the sub-blocks; the first word line intersects columns at a first range of one or more column diameters; the second word line intersects columns at a second range of one or more column diameters, the first range of one or more column diameters is different than and disjoint from the second range of one or more column diameters; and the first predetermined offset is based on the first range of one or more column diameters and the second range of one or more column diameters.

In one example implementation: each block comprises a stack of dielectric layers alternating with conductive layers and vertical columns of materials through the stack that form the memory cells, at least a subset of the conducting layers form 2N word lines, the vertical columns have diameters that increase from bottom of the vertical columns to top of the vertical columns within the sub-blocks; the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line; the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line; each word line of a lower sub-block has a corresponding word line of an upper sub-block that has a same sequence number such that a pair of corresponding word lines comprises a word line of a lower sub-block and a word line of an upper sub-block both having the same sequence number; the vertical columns are divided into zones based on diameter such that each zone includes a contiguous set of word lines within a single range of diameters of the vertical columns; each block includes a set of offset regions, each offset region includes one or more pairs of corresponding word lines such that each word line of the respective offset region that is in an upper sub-block is in a same zone and each word line of the respective offset region that is in a lower sub-block is in a same zone; and each offset region is associated with a predetermined offset; and the first word line in the lower sub-block of the first block of the first plane has a physical word line number WLn, the second word line in the upper sub-block of the second block of the second plane has a physical word line number WLm, m+n=2N-1.

In one example implementation: each block comprises a stack of dielectric layers alternating with conductive layers and vertical columns of materials through the stack that form the memory cells, the vertical columns have diameters that increase from bottom of the vertical columns to top of the vertical columns within the sub-blocks; the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line; the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line; each word line of a lower sub-block has a corresponding word line of an upper sub-block that has a same sequence number such that a pair of corresponding word lines comprises a word line of a lower sub-block and a word line of an upper sub-block both having the same sequence number; the vertical columns are divided into zones based on diameter such that each zone includes a contiguous set of word lines within a single range of diameters of the vertical columns; each block includes a set of offset regions, each offset region includes one or more pairs of corresponding word lines such that each word line of the respective offset region that is in an upper sub-block is in a same zone and each word line of the respective offset region that is in a lower sub-block is in a same zone; each offset region is associated with a voltage magnitude offset; the first predetermined pair of corresponding word lines, which comprise the first word line in the lower sub-block of the first block of the first plane and the second word line in the upper sub-block of the second block of the second plane, are in a first offset region assigned a first voltage magnitude as the first predetermined offset.

In one example implementation: each block comprises a stack of dielectric layers alternating with conductive layers and vertical columns of materials through the stack that form the memory cells, the vertical columns have diameters that increase from bottom of the vertical columns to top of the vertical columns within the sub-blocks; the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line; the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line; each word line of a lower sub-block has a corresponding word line of an upper sub-block that has a same sequence number such that a pair of corresponding word lines comprises a word line of a lower sub-block and a word line of an upper sub-block both having the same sequence number; the vertical columns are divided into zones based on diameter such that each zone includes a contiguous set of word lines within a single range of diameters of the vertical columns; each block includes a set of offset regions, each offset region includes one or more pairs of corresponding word lines such that each word line of the respective offset region that is in an upper sub-block is in a same zone and each word line of the respective offset region that is in a lower sub-block is in a same zone; each offset region is associated with a predetermined offset of a set of predetermined offsets that includes the first predetermined offset; and the first predetermined pair of corresponding word lines are in a first offset region that is assigned first predetermined offset.

In one example implementation: the offset regions are non-overlapping; the zones are non-overlapping; each offset region is assigned a different predetermined offset of the set of predetermined offsets; each offset regions is capable of being assigned a different predetermined offset of the set of predetermined offsets; and/or the one or more control circuits are configured to store separate and independent predetermined offsets for each offset region.

One embodiment includes a method of operating non-volatile storage comprising multiple planes of non-volatile memory cells including a first plane and a second plane, each plane comprising blocks of non-volatile memory cells, each block comprises a stack of dielectric layers alternating with conductive layers and vertical columns of materials through the stack that form the memory cells, each block comprises sub-blocks including an upper sub-block and a lower sub-block, the vertical columns have diameters that increase from bottom of the vertical columns to top of the vertical columns within the sub-blocks, the method comprising: receiving first data; receiving a first address for the first data, the first address corresponds to a first set of memory cells connected a first word line in a lower sub-block of a first block in the first plane, the first word line intersects columns at a first range of one or more column diameters; receiving second data separately from the first data; receiving a second address for the second data, the second address corresponds to a second set of memory cells connected to a second word line in an upper sub-block of a second block in the second plane, the second word line intersects columns at a second range of one or more column diameters, the first range of one or more column diameters is different than and disjoint from the second range of one or more column diameters; and concurrently programming the first data to the first set of memory cells and the second data to the second set of memory cells by concurrently applying a common programming signal to the first word line and the second word line such that the common programming signal comprises a standard programming signal modified by a offset assigned to both the first word line and the second word line based on the first range of one or more column diameters and the second range of one or more column diameters.

One embodiment includes a non-volatile storage apparatus, comprising: multiple planes of non-volatile memory cells, each plane comprising blocks of non-volatile memory cells, each block comprises a stack of dielectric layers alternating with conductive layers and vertical columns of materials through the stack that form the memory cells, at least a subset of the conducting layers form 2N word lines, each block comprises sub-blocks including an upper sub-block and a lower sub-block, the vertical columns have diameters that increase from bottom of the vertical columns to top of the vertical columns within the sub-blocks; and one or more control circuits connected to the non-volatile memory structure, the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line, the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line, each word line of a lower sub-block has a corresponding word line of an upper sub-block that has a same sequence number such that a pair of corresponding word lines comprises a word line of a lower sub-block and a word line of an upper sub-block both having the same sequence number, the vertical columns are divided into zones based on diameter such that each zone includes a contiguous set of word lines within a single range of diameters of the vertical columns, each block includes a set of offset regions, each offset region includes one or more pairs of corresponding word lines such that each word line of the respective offset region that is in an upper sub-block is in a same zone and each word line of the respective offset region that is in a lower sub-block is in a same zone, each offset region is associated with a program voltage offset and a program pulse width offset. The one or more control circuits are configured to concurrently program memory cells connected to a pair of corresponding word lines including WLn in a lower sub-block of first block of a first plane and WLm in an upper sub-block of second block in a second plane, such that m+n=2N-1, using a common programming voltage signal applied to WLn for the first block of the first plane and applied to WLm for the second block of the second plane that comprises a plurality of voltage pulses having a pulse width of a standard pulse width modified by a pulse width offset for an offset region that includes WLn and WLm and magnitudes of standard program signal magnitudes modified by a program voltage offset for the offset region that includes WLn and WLm.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
multiple planes of non-volatile memory cells, each plane comprises word lines and blocks of non-volatile memory cells, each block comprises sub-blocks including an upper sub-block and a lower sub-block, the word lines are grouped into predetermined pairs of corresponding word lines such that a predetermined pair of corresponding word lines comprises a word line of a lower sub-block and a word line of an upper sub-block, each predetermined pair of corresponding word lines is assigned a predetermined offset, each of the blocks comprises a plurality of vertical columns that are intersected by the word lines, the vertical columns have diameters that increase from bottom of the vertical columns to top of the vertical columns within the sub-blocks; and
one or more control circuits connected to the multiple planes, the one or more control circuits are configured to concurrently program memory cells connected to a first predetermined pair of corresponding word lines including memory cells connected to a first word line in a lower sub-block of a first block of a first plane and memory cells connected to a second word line in an upper sub-block of a second block of a second plane using a common programming voltage signal concurrently applied to the first word line intersecting vertical columns at a first range of one or more column diameters and the second word line intersecting vertical columns at a second range of one or more column diameters, the first range of one or more column diameters is different than and disjoint from the second range of one or more column diameters, the common programming voltage signal comprises a standard programming voltage signal modified by a first predetermined offset assigned to the first predetermined pair of corresponding word lines.

2. The non-volatile storage apparatus of claim 1, wherein:
each predetermined pair of corresponding word lines is assigned a predetermined voltage offset; and
the first predetermined offset is a first voltage offset assigned to the first predetermined pair of corresponding word lines, which comprise the first word line in the lower sub-block of the first block of the first plane and the second word line in the upper sub-block of the second block of the second plane.

3. The non-volatile storage apparatus of claim 1, wherein:
the common programming voltage signal comprises a set of voltage pulses having a pulse width;
each predetermined pair of corresponding word lines is assigned a predetermined timing offset; and
the first predetermined offset is a first timing offset assigned to the first predetermined pair of corresponding word lines that changes the pulse width.

4. The non-volatile storage apparatus of claim 1, wherein:
each predetermined pair of corresponding word lines is assigned a predetermined pre-charge timing offset; and
the one or more control circuits are configured to, prior to concurrently programming memory cells, concurrently pre-charge the memory cells for a time period comprising a standard time period adjusted by a first predetermined pre-charge timing offset assigned to the first predetermined pair of corresponding word lines.

5. The non-volatile storage apparatus of claim 1, wherein:
each block comprises a stack of dielectric layers alternating with conductive layers and the vertical columns of materials through the stack that form the memory cells, at least a subset of the conducting layers form 2N word lines;

the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line;

the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line;

each word line of a lower sub-block has a corresponding word line of an upper sub-block that has a same sequence number such that a pair of corresponding word lines comprises a word line of a lower sub-block and a word line of an upper sub-block both having the same sequence number;

the vertical columns are divided into zones based on diameter such that each zone includes a contiguous set of word lines within a single range of diameters of the vertical columns;

each block includes a set of offset regions, each offset region includes one or more pairs of corresponding word lines such that each word line of the respective offset region that is in an upper sub-block is in a same zone and each word line of the respective offset region that is in a lower sub-block is in a same zone; and each offset region is associated with a predetermined offset; and the first word line in the lower sub-block of the first block of the first plane has a physical word line number WLn, the second word line in the upper sub-block of the second block of the second plane has a physical word line number WLm, m+n=2N-1.

6. The non-volatile storage apparatus of claim 1, wherein:
each block comprises a stack of dielectric layers alternating with conductive layers and the vertical columns of materials through the stack that form the memory cells;

the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line;

the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line;

each word line of a lower sub-block has a corresponding word line of an upper sub-block that has a same sequence number such that a pair of corresponding word lines comprises a word line of a lower sub-block and a word line of an upper sub-block both having the same sequence number;

the vertical columns are divided into zones based on diameter such that each zone includes a contiguous set of word lines within a single range of diameters of the vertical columns;

each block includes a set of offset regions, each offset region includes one or more pairs of corresponding word lines such that each word line of the respective offset region that is in an upper sub-block is in a same zone and each word line of the respective offset region that is in a lower sub-block is in a same zone;

each offset region is associated with a voltage magnitude offset;

the first predetermined pair of corresponding word lines, which comprise the first word line in the lower sub-block of the first block of the first plane and the second word line in the upper sub-block of the second block of the second plane, are in a first offset region assigned a first voltage magnitude as the first predetermined offset.

7. The non-volatile storage apparatus of claim 6, wherein:
each offset region is associated with a program pulse width offset;

the first offset region is assigned a first pulse width offset;

the common programming voltage signal comprises a plurality of voltage pulses having a pulse width of a standard pulse width modified by the first pulse width offset.

8. The non-volatile storage apparatus of claim 7, wherein:
the non-volatile memory cells are arranged in NAND strings; and the one or more control circuits are configured to precharge NAND strings connected to the first word line and NAND strings connected to the second word line for a time period equal to a standard pre-charge time period modified by a pre-charge offset assigned to the first offset region.

9. The non-volatile storage apparatus of claim 1, wherein:
each block comprises a stack of dielectric layers alternating with conductive layers and the vertical columns of materials through the stack that form the memory cells;

the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line;

the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line;

each word line of a lower sub-block has a corresponding word line of an upper sub-block that has a same sequence number such that a pair of corresponding word lines comprises a word line of a lower sub-block and a word line of an upper sub-block both having the same sequence number;

the vertical columns are divided into zones based on diameter such that each zone includes a contiguous set of word lines within a single range of diameters of the vertical columns;

each block includes a set of offset regions, each offset region includes one or more pairs of corresponding word lines such that each word line of the respective offset region that is in an upper sub-block is in a same zone and each word line of the respective offset region that is in a lower sub-block is in a same zone;

each offset region is associated with a predetermined offset of a set of predetermined offsets that includes the first predetermined offset; and the first predetermined pair of corresponding word lines are in a first offset region that is assigned first predetermined offset.

10. The non-volatile storage apparatus of claim 9, wherein:
the offset regions are non-overlapping.

11. The non-volatile storage apparatus of claim 9, wherein:
the zones are non-overlapping.

12. The non-volatile storage apparatus of claim 9, wherein:
each offset regions is assigned a different predetermined offset of the set of predetermined offsets.

13. The non-volatile storage apparatus of claim 9, wherein:
each offset regions is capable of being assigned a different predetermined offset of the set of predetermined offsets.

14. The non-volatile storage apparatus of claim 9, wherein:
the one or more control circuits are configured to store separate and independent predetermined offsets for each offset region.

15. A method of operating non-volatile storage comprising multiple planes of non-volatile memory cells including a first plane and a second plane, each plane comprising blocks of non-volatile memory cells, each block comprises a stack of dielectric layers alternating with conductive layers and vertical columns of materials through the stack that form the memory cells, each block comprises sub-blocks including an upper sub-block and a lower sub-block, the vertical columns have diameters that increase from bottom of the vertical columns to top of the vertical columns within the sub-blocks, the method comprising:

receiving first data;

receiving a first address for the first data, the first address corresponds to a first set of memory cells connected a first word line in a lower sub-block of a first block in the first plane, the first word line intersects vertical columns at a first range of one or more column diameters;

receiving second data separately from the first data;

receiving a second address for the second data, the second address corresponds to a second set of memory cells connected to a second word line in an upper sub-block of a second block in the second plane, the second word line intersects columns at a second range of one or more column diameters, the first range of one or more column diameters is different than and disjoint from the second range of one or more column diameters; and concurrently programming the first data to the first set of memory cells and the second data to the second set of memory cells by concurrently applying a common programming signal to the first word line that intersects vertical columns at the first range of one or more column diameters and the second word line that intersects vertical columns at the second range of one or more column diameters such that the common programming signal comprises a standard programming signal modified by a offset assigned to both the first word line and the second word line based on the first range of one or more column diameters and the second range of one or more column diameters.

16. The method of claim 15, wherein:
the offset comprises a change to a voltage magnitude of the standard programming signal.

17. The method of claim 15, wherein:
the common programming signal comprises a series of voltage pulses; and
the offset comprises a change to a voltage pulse width of the standard programming signal.

18. A non-volatile storage apparatus, comprising:
multiple planes of non-volatile memory cells, the non-volatile memory cells are arranged in NAND strings, each plane comprising blocks of non-volatile memory cells, each block comprises a stack of dielectric layers alternating with conductive layers and vertical columns of materials through the stack that form the memory cells, at least a subset of the conducting layers form 2N word lines, each block comprises sub-blocks including an upper sub-block and a lower sub-block, the vertical columns have diameters that increase from bottom of the vertical columns to top of the vertical columns within the sub-blocks; and one or more control circuits connected to the non-volatile memory structure, the one or more control circuits are configured to program memory cells of upper sub-blocks in a sequence from bottom word line to top word line such that word lines of upper sub-blocks have a sequence number based on when memory cells connected to the respective word line are programmed in the sequence from bottom word line to top word line, the one or more control circuits are configured to program memory cells of lower sub-blocks in a sequence from top word line to bottom word line such that word lines of lower sub-blocks have a sequence number based on when memory cells of the respective word line are programmed in the sequence from top word line to bottom word line, each word line of a lower sub-block has a corresponding word line of an upper sub-block that has a same sequence number such that a pair of corresponding word lines comprises a word line of a lower sub-block and a word line of an upper sub-block both having the same sequence number, the vertical columns are divided into zones based on diameter such that each zone includes a contiguous set of word lines within a single range of diameters of the vertical columns, each block includes a set of offset regions, each offset region includes one or more pairs of corresponding word lines such that each word line of the respective offset region that is in an upper sub-block is in a same zone and each word line of the respective offset region that is in a lower sub-block is in a same zone, each offset region is associated with a program voltage offset and a program pulse width offset;

the one or more control circuits are configured to concurrently program memory cells connected to a pair of corresponding word lines including WLn in a lower sub-block of first block of a first plane and WLm in an upper sub-block of second block in a second plane, such that m+n=2N-1, using a common programming voltage signal applied to WLn for the first block of the first plane and applied to WLm for the second block of the second plane that comprises a plurality of voltage pulses having a pulse width of a standard pulse width modified by a pulse width offset for an offset region that includes WLn and WLm and magnitudes of standard program signal magnitudes modified by a program voltage offset for the offset region that includes WLn and WLm;

the one or more control circuits are configured to pre-charge NAND strings connected to WLn in the lower sub-block of first block of the first plane and NAND strings connected to WLm in the upper sub-block of second block in the second plane for a time period equal to a standard pre-charge time period modified by a pre-charge offset for the offset region that includes WLn and WLm.

* * * * *